US008569752B2

(12) United States Patent
Towns et al.

(10) Patent No.: US 8,569,752 B2
(45) Date of Patent: Oct. 29, 2013

(54) POLAR SEMICONDUCTOR HOLE TRANSPORTING MATERIAL

(75) Inventors: Carl R. Towns, Essex (GB); Caroline Towns, legal representative, Cambridgeshire (GB); Mary J. McKiernan, Cambridgeshire (GB); Annette Steudel, Cambridge (GB)

(73) Assignees: Cambridge Display Technology Limited, Cambridgeshire (GB); CDT Oxford Limited, Cambridgeshire (GB)

( * ) Notice: Subject to any disclaimer, the term of this patent is extended or adjusted under 35 U.S.C. 154(b) by 0 days.

(21) Appl. No.: 13/460,784

(22) Filed: Apr. 30, 2012

(65) Prior Publication Data
US 2012/0217490 A1 Aug. 30, 2012

Related U.S. Application Data

(63) Continuation of application No. 11/664,745, filed as application No. PCT/GB2005/003892 on Oct. 11, 2005, now Pat. No. 8,173,996.

(30) Foreign Application Priority Data

Oct. 11, 2004 (GB) .................................. 0422550.4
Jul. 14, 2005 (GB) .................................. 0514498.5

(51) Int. Cl.
*H01L 35/24* (2006.01)
(52) U.S. Cl.
USPC ..................................... 257/40; 257/E51.001
(58) Field of Classification Search
USPC ............................................ 257/40, E51.001
See application file for complete search history.

(56) References Cited

U.S. PATENT DOCUMENTS

| 5,523,555 | A | 6/1996 | Friend et al. |
| 5,900,327 | A | 5/1999 | Pei et al. |
| 5,962,361 | A | 10/1999 | Zum Mallen |
| 5,962,631 | A | 10/1999 | Woo et al. |
| 6,107,452 | A | 8/2000 | Miller et al. |
| 2003/0059975 | A1 | 3/2003 | Sirringhaus et al. |
| 2005/0082515 | A1 | 4/2005 | Masuichi et al. |
| 2007/0274357 | A1 | 11/2007 | Bazan et al. |

FOREIGN PATENT DOCUMENTS

| JP | 2002-050482 | 2/2002 |
| JP | 2002-319488 | 10/2002 |
| JP | 2003-007475 | 1/2003 |
| JP | 2003-077673 | 3/2003 |
| JP | 2003-217863 | 7/2003 |
| JP | 2004-253370 | 9/2004 |
| JP | 2007-506283 | 3/2007 |
| WO | WO-90/13148 | 11/1990 |
| WO | WO-94/03030 | 2/1994 |
| WO | WO-94/29883 | 12/1994 |
| WO | WO-96/16449 | 5/1996 |
| WO | WO-96/20253 | 7/1996 |
| WO | WO-99/48160 | 9/1999 |
| WO | WO-00/53656 | 9/2000 |
| WO | WO-00/79617 | 12/2000 |
| WO | WO-01/47043 | 6/2001 |
| WO | WO-02/26859 | 4/2002 |
| WO | WO-02/092723 | 11/2002 |
| WO | WO-2004/023573 | 3/2004 |
| WO | WO 2005/056628 | 6/2005 |

OTHER PUBLICATIONS

Bernius et al., "Progress with Light-Emitting Polymers," *Adv. Mater.*, 12(23):1737-1750 (2000).
Huang et al., "High-Efficiency, Environment-Friendly Electroluminescent Polymers with Stable High Work Function Metal as a Cathode: Green- and Yellow-Emitting Conjugated Polyfluorene Polyelectrolytes and Their Neutral Precursors," *J. Am. Chem. Soc.*, 126(31):9845-9853 (2004).
Huang et al., "Novel Electroluminescent Conjugated Polyelectrolytes Based on Polyfluorene," *Chem. Mat.*, 16(4):708-716 (2004).
Kim et al., "Synthesis and Properties of Novel Triphenylamine Polymers Containing Ethynyl and Aromatic Moieties," *Synthetic Metals*, 122:363-368 (2001).
Kim et al., "Water Soluble Photo- and Electroluminescent Alkoxy-Sulfonated Poly(*p*-phenylenes) Synthesized via Palladium Catalysis," *Macromolecules*, 31:964-974 (1998).
Pei et al., "Efficient Photoluminescence and Electroluminescence from a Soluble Polyfluorene," *J. Am. Chem. Soc.*, 118:7416-7417 (1996).
Yamamoto, "Electrically Conducting and Thermally Stable π-Conjugated Poly(arylene)s Prepared by Organometallic Processes," *Progress in Polymer Science*, 17:1153-1205 (1993).
Combined Search and Examination Report for Application No. GB0422550.4, dated Jan. 31, 2005.
International Preliminary Report on Patentability for International Application No. PCT/GB2005/003892, dated Apr. 11, 2007.
International Search Report for International Application No. PCT/GB2005/003892, dated Jan. 16, 2006.
Written Opinion for International Application No. PCT/GB2005/003892, dated Apr. 11, 2007.

*Primary Examiner* — Anthony Ho
(74) *Attorney, Agent, or Firm* — Marshall, Gerstein & Borun LLP

(57) ABSTRACT

A semiconductive hole transport material containing polar substituent groups, the polar substituent groups substantially not affecting the electronic properties of the hole transport material and the hole transport material being soluble in a polar solvent.

12 Claims, No Drawings

POLAR SEMICONDUCTOR HOLE TRANSPORTING MATERIAL

CROSS-REFERENCE TO RELATED APPLICATION

This is a continuation of U.S. patent application Ser. No. 11/664,745 filed Feb. 5, 2009 (now U.S. Pat. No. 8,173,996), which is the national phase of PCT/GB2005/003892 filed Oct. 11, 2005, the entire respective disclosures of which are incorporated by reference in their entirety.

BACKGROUND OF THE INVENTION

1. Field of the Invention

The invention is concerned with methods for making an organic electronic device. The present invention also is concerned with electronic devices preparable by the present methods. The invention also is concerned with hole transport materials for use in electronic devices and to methods for making the same.

2. Related Technology

Such organic devices include organic light-emitting diodes (OLEDs). One or more of the layers in the device typically will comprise a polymer. Further, such devices typically comprise one or more semiconductive polymer layers located between electrodes. Semiconductive polymers are characterised by partial or substantial pi-conjugation in the backbone or side chains.

Semiconductive polymers are now frequently used in a number of optical devices such as in polymeric light emitting devices ("PLEDs") as disclosed in WO 90/13148; field effect transistors ("FETs"); photovoltaic devices as disclosed in WO 96/16449; and photodetectors as disclosed in U.S. Pat. No. 5,523,555.

A typical LED comprises a substrate, on which is supported an anode, a cathode, and an organic electroluminescent layer located between the anode and cathode and comprising at least one electroluminescent material. In operation, holes are injected into the device through the anode and electrons are injected into the device through the cathode. The holes and electrons combine in the organic electroluminescent layer to form an exciton, which then undergoes radiative decay to give light. Other layers may be present in the LED. For example a layer of organic hole injection material such as poly(ethylene dioxythiophene) (PEDT) doped with a charge balancing dopant may be provided between the anode and the organic electroluminescent layer to assist injection of holes from the anode to the organic electroluminescent layer. The charge balancing dopant may be acidic. The charge balancing dopant may be a polyanion. Preferably the charge balancing dopant comprises a sulfonate, such as poly(styrene sulfonate) (PSS).

Further, a layer of an organic hole transport material may be provided between the anode (or the hole injection layer where present) and the organic electroluminescent layer to assist transport of holes to the organic electroluminescent layer.

Generally, it is desired that the polymer or polymers used in the afore-mentioned organic devices are soluble in common organic solvents to facilitate their deposition during device manufacture. Many such polymers are known. One of the key advantages of this solubility is that a polymer layer can be fabricated by solution processing, for example by spin-casting, ink-jet printing, screen-printing, dip-coating etc. Examples of such polymers are disclosed in, for example, Adv. Mater. 2000 12(23) 1737-1750 and include polymers with at least partially conjugated backbones formed from aromatic or heteroaromatic units such as fluorenes, indenofluorenes, phenylenes, arylene vinylenes, thiophenes, azoles, quinoxalines, benzothiadiazoles, oxadiazoles, thiophenes, and arylamines with solubilising groups, and polymers with non-conjugated backbones such as poly(vinyl carbazole). Polyarylenes such as polyfluorenes have good film forming properties and may be readily formed by Suzuki or Yamamoto polymerisation which enables a high degree of control over the regioregularity of the resultant polymer.

In certain devices, it can be desirable to cast multiple layers, i.e., laminates, of different materials (typically polymers) on a single substrate surface. For example, this could be to achieve optimisation of separate functions, for example electron or hole charge transport, luminescence control, photon-confinement, exciton-confinement, photo-induced charge generation, and charge blocking or storage.

In this regard, it can be useful to be able to fabricate multilayers of materials (such as polymers) to control the electrical and optical properties, for example, across the device. This can be useful for optimum device performance. Optimum device performance can be achieved, for example, by careful design of the electron and hole transport level offset, of the optical refractive index mismatch, and of the energy gap mismatch across the interface. Such heterostructures can, for example, facilitate the injection of one carrier but block the extraction of the opposite carrier and/or prevent exciton diffusion to the quenching interface. Thereby, such heterostructures can provide useful carrier and photon confinement effects.

However, preparation of polymer laminates generally is not trivial. In particular, the solubility of initially cast or deposited layers in the solvents used for succeeding layers can be problematic. This is because solution deposition of the subsequent layer can dissolve and destroy the integrity of the previous layer.

One option for overcoming this problem is to work with precursor polymer systems. Precursor systems of PPV (polyphenylene vinylene) and PTV (polythienylene vinylene) are known in this art.

Layers of semiconducting polymers may be formed by depositing a soluble polymeric precursor which is then chemically converted to an insoluble, electroluminescent form. For example, WO 94/03030 discloses a method wherein insoluble, electroluminescent poly(phenylene vinylene) is formed from a soluble precursor and further layers are then deposited from solution onto this insoluble layer.

However, it is clearly undesirable to restrict the polymer in a polymer device to that class of polymers that may be formed from insoluble precursor polymers. Furthermore, the chemical conversion process required for precursor polymers involves extreme processing conditions and reactive by-products that may harm the performance of the prior layers in the finished device.

A number of publications disclose devices where two layers are solution processed during device manufacture such that the solvent use for the second layer does not dissolve the first layer.

One approach is to form the first layer and then to crosslink the first layer to render it insoluble so that the second layer then can be formed.

WO96/20253 generally describes a luminescent film-forming solvent processable polymer which contains crosslinking. It is stated that because the thin films resist dissolution in common solvents this enables deposition of further layers, thereby facilitating device manufacture. The use of azide groups attached to the polymer main chain is mentioned as an example of thermal crosslinking.

U.S. Pat. No. 6,107,452 discloses a method of forming a multilayer device wherein fluorene containing oligomers comprising terminal vinyl groups are deposited from solution and cross-linked to form insoluble polymers onto which additional layers may be deposited.

Similarly, Kim et al, Synthetic Metals 122 (2001), 363-368 discloses polymers comprising triarylamine groups and ethynyl groups which may be cross-linked following deposition of the polymer.

Problems exist with these crosslinking methods since the device must be subjected to crosslinking conditions e.g. heating after the deposition of a layer. This can have detrimental effects on the already deposited layer. Crosslinking methods also can result in side products, which can contaminate the film. Further, disadvantageous side radical reactions can occur. These side radical reactions result in less than the maximum degree of crosslinking being obtained and the functionality of the polymer being affected.

WO 2004/023573 is concerned with a method of forming an optical device comprising the steps of providing a substrate comprising a first electrode capable of injecting or accepting charge carriers of a first type; forming over the first electrode a first layer that is at least partially insoluble in a solvent by depositing a first semiconducting material that is free of cross-linkable vinyl or ethynyl groups and is, at the time of deposition, soluble in the solvent; forming a second layer in contact with the first layer and comprising a second semiconducting material by depositing a second semiconducting material from a solution in the solvent; and forming over the second layer a second electrode capable of injecting or accepting charge carriers of a second type wherein the first layer is rendered at least partially insoluble by one or more of heat, vacuum and ambient drying treatment following deposition of the first semiconducting material.

JP 2003-217863 takes a different approach. In particular, this disclosure teaches the presence of a compound in a solution deposited layer, where the compound can render the layer insoluble upon heating. In one example, a hole transport layer of F8 doped with an electron acceptor of an antimony hexachloride salt of tri(bromophenyl) amine is used. The layer is deposited from tetrahydrofuran and insolubilised by heating at 100° C. for 20 hours. An emissive layer of F8 then is deposited from xylene solution. Doping of the F8 polymer alters its charge transporting properties, providing it with hole transporting functionality. However if a soluble material that possesses suitable hole transporting functionality is treated with a doping agent, then this will result in an undesirable alteration of that functionality.

A further option for overcoming this problem is to use polymers materials that differ widely in their solubility behaviour so that a different solvent (in which the first layer is not soluble) can be used to deposit the second layer. Again, this option severely restricts the classes of materials that can be used in a multilayered stack. This is because most conjugated polymer systems are characterised by solubility in the same set of hydrocarbon solvents (such as xylenes and other substituted benzenes and tetrahydrofuran, and halogenated solvents).

For example, the use of a polymer that is soluble in a hydrocarbon solvent in conjunction with a polymer that is soluble in water or in an acetate solvent can allow the preparation of a limited bilayer or trilayer stack. An important example in this respect is the deposition of a conjugated polymer from an aromatic hydrocarbon solvent over a first-formed conductive PEDT:PSS film that is not soluble in the aromatic hydrocarbon solvent.

US 2002/096995 discloses the following multilayer structure in Example 1:
ITO;
Poly(ethylene dioxythiophene)/poly(styrene sulfonate) "PEDT/PSS";
emissive layer of Ir(ppy)3/"PVK" by spin coating from 1,2-dichloroethane;
electron transport layer of 1,3,5-tris(N-phenylbenzimidazol-2-yl)benzene "TPBI"/polyvinylbutyryl binder by spin coating from 1-butanol.

JP 2002-050482 is concerned generally with providing a high brightness, efficient, organic LED. Generally, this disclosure is concerned with an organic light-emitting device with two different luminescent layers. The first luminescent layer contains an ortho-metallated complex and has a first emission spectrum and the second luminescent layer contains a macromolecule which has a different emission spectrum from the first luminescent layer. This arrangement is said to lead to an efficient device with high brightness. The following multilayer structure is disclosed in Example 1:
ITO;
poly(ethylene dioxythiophene) "PEDT";
"First luminous layer" of Ir(ppy)3/poly(N-vinylcarbazole) "PVK" deposited by spin coating from 1,2-dichloroethane;
"Second luminous layer" of a blend of poly(9,9' n-octyl fluorene) "F8", F8-amine copolymer and a diazole deposited by spin-coating from xylene solution.

JP 2003-077673 also is concerned with achieving high brightness and efficiency in organic electroluminescent devices. In one example in JP 2003-077673, a device has a hole transport layer, an emissive layer and an electron transport layer. The device is formed by solution processing of two of the layers wherein the solvent used for the emissive layer does not dissolve the hole transport layer and/or the solvent used for the emissive layer does not dissolve the electron transport layer. In one example, the device structure is as follows:
hole transport layer of PVK formed by spin-coating from 1,2-dichloroethane;
emissive layer of F8/Ir(ppy)3 formed by spin-coating from xylene;
electron transport layer Alq formed by evaporation.

JP 2002-319488 is concerned with avoiding problems associated with using vacuum over evaporation during device manufacture. In Example 1, the following multilayer structure is used:
hole transport layer of PVK formed by spincoating from 1,2-dichloroethane;
emissive layer of polystyrene/polyvinyl biphenyl "PBD"/ Ir(ppy)3 formed by spin-coating from cyclohexane.
In Example 3, the following multilayer structure is used:
hole transport layer of PVK formed by spin-coating from 1,2-dichloroethane;
emissive layer of polyvinyl biphenyl/"OXD-1"/Ir(ppy)3 formed by spin-coating from xylene; "OXD-1" is defined in JP 2002-319488;
electron transport layer of polystyrene/PBD deposited from cyclohexane.

JP 2003-007475 again is concerned with providing an efficient electroluminescent element with high brightness. In particular, this disclosure is concerned with lowering the voltage needed to drive the device. The following multilayer structure is disclosed:

hole transport layer of dibutyl fluorene deposited from 1,2-dichloroethane;

emissive layer of "polyvinyl biphenyl"/carbazole biphenyl "CBP"/Ir(ppy)3 formed by spin-coating from xylene;

electron transport layer of OXD-1 as defined in JP 2003-007475 formed by evaporation.

In these disclosures, the devices are designed within the confines of selecting materials with the desirable solubility behaviour so that laminates may be made. It will be appreciated that limitations on the materials that are useable in the laminate mean that many concepts of device structure cannot be investigated or implemented. As such, the further development of device architecture may become heavily impeded.

J. Am. Chem. Soc. 1996, 118, 7416-7417 discloses the use of BDOH-PF in a single layer LED and LEC. BDOH-PF is soluble in THF and toluene and other common organic solvents. An LED is fabricated by sandwiching a thin film of BDOH-PF (as the emitter) between an ITO-coated glass anode and a vacuum evaporated cathode. An LEC is fabricated using a blend of BDOH-PF with lithium triflate. A thin film of the blend was sandwiched between and ITO-coated glass anode and a vacuum evaporated aluminium film.

WO 01/47043 is concerned with a method for forming a transistor comprising: depositing a first material from solution in a first solvent; and subsequently whilst the first material remains soluble in the first solvent, forming a second layer of the transistor by depositing over the first material the second material from solution in a second solvent in which the first material is substantially insoluble. According to one preferred embodiment described on page 4 of WO 01/47043 one of the first and second solvents is a polar solvent and the other of the first and second solvents is a non-polar solvent. As such, one of the first and second layers may be a non-polar polymer layer that is soluble in a non-polar solvent and the other of the first and second layers may be a polar polymer layer that is soluble in a polar solvent. There is no mention of a hole transport material or a hole transport layer. As described above, the invention that is the subject of WO 01/47043 works within the confines of selecting materials with the desirable solubility behaviour, thus, similar limitations exist on the materials that are useable in the invention according to WO 01/47043.

Chem. Mater., 2004, 16, 708-716 discloses two conjugated polyelectrolytes (P2, P4), which are soluble in polar solvents. Further, J. Am. Chem. Soc., 2004, 126 (31), 9845-9853 discloses the quarternised ammonium polyelectrolyte derivatives of a series of aminoalkyl-substituted polyfluorene copolymers with benzothiadiazole, which were synthesised by the Suzuki coupling reaction. The quarternised polymers are soluble in DMSO, methanol, and DMF. It is said that the solubility of these quarternised polymers in alcohol offers an opportunity of fabricating multilayer polymer LEDs by spin coating from such solvents, since most of the electroluminescent polymers and carrier transporting materials are not soluble in the alcohol.

Reference may also be made to U.S. Pat. No. 5,900,327, which discloses the use of fluorenes and polyfluorenes having one or two polar substituents, for use as luminescent materials in organic light-emitting devices.

WO 99/48160 is concerned with an electroluminescent device comprising a first charge carrier injecting layer for injecting positive charge carriers; a second charge carrier injecting layer for injecting negative charge carriers; and a light-emissive layer located between the charge carrier injecting layers and comprising a mixture of a first component for accepting positive charge carriers from the first charge carrier injecting layer; a second component for accepting negative charge carriers from the second charge carrier injecting layer; and a third, organic light-emissive component for generating light as a result of combination of charge carriers from the first and second components. At least one of the first, second and third components forms a type II semiconductor interface with another of the first, second and third components.

In view of the above it will be understood that there still remains a need to provide further methods for fabricating multilayer organic (typically polymer) electronic devices.

DESCRIPTION OF THE INVENTION

As such, the invention provides a new method for organic electronic device manufacture, preferably that is compatible with high performance. Further it is an aim of the present invention to provide devices obtainable by the new method.

The invention provides new means for controlling the processing properties of materials used in the manufacture of multilayer organic (typically polymer) electronic devices. The new means comprise the introduction by design of polar groups into a material to alter the solubility behaviour of that material, thereby rendering it soluble in polar solvents.

Thus, the invention provides a method of controlling the processing properties of a material for use in an organic electronic device, comprising the step of:

forming a material comprising polar substituent groups in a manner enabling it to be laid down as a film by solution processing from a polar solvent, where the polar substituents control the processing properties of the material to render it soluble in the polar solvent.

For optimising solution processing, particularly ink jet printing, a mixture of solvents may be present.

According to the invention, the number and nature of polar substituent groups are selected so as to control the processing properties of the material to render it soluble in a polar solvent. This may be contrasted with prior art materials containing polar substituent groups, where the polar substituent groups are not present by design for the purpose of controlling the processing properties of the material.

The method outlined above of controlling the processing properties of a material, can be considered to be the inventive concept underlying the invention and can be applied in practice in several methods of device manufacture. These include those discussed below in relation to the first, second, third, fourth and sixth aspects of the invention.

In accordance with the first aspect, the method of controlling the processing properties is applied to a hole transport material by incorporating polar substituent groups thereinto.

Thus the first aspect of the invention provides, a method for forming an organic electronic device, including the steps of:

depositing a semiconductive hole transport material from solution in a polar solvent to form a hole transport layer of the device; and subsequently forming a second layer of the device by depositing on the hole transport layer a second material from solution in a non-polar solvent in which the hole transport layer is substantially insoluble; and characterised in that the hole transport material contains polar substituent groups selected so that the hole transport material is soluble in the polar solvent, the second material being substantially insoluble in the polar solvent.

For optimising solution processing, particularly ink jet printing, a mixture of solvents may be present in the aforementioned solutions.

Advantageously, the step of forming the second layer can be carried out while the hole transport material remains soluble in the polar solvent. Thus, there is no need to crosslink the hole transport material after deposition.

Unlike for an emissive material, any change in the emission spectrum of the hole transport material that is caused by the incorporation of the polar substituent groups is not of consequence to device performance. Further, rendering a hole transport material soluble in polar solvents but insoluble in non-polar solvents enables deposition of the subsequent (typically emissive) layer from a non-polar solvent. This is advantageous since most known emissive materials are soluble in non-polar solvents.

As mentioned above, historically, preferred polymers used in organic electronic devices have been soluble in common organic solvents, such as alkylated benzenes, in particular xylene, and toluene. Such polymers are insoluble in polar solvents. Therefore, according to the present method the integrity of a hole transport material whose processing properties have been controlled in accordance with the present invention will not be affected by the deposition thereon of a polymer in a common organic solvent.

The polar substituent groups are covalently attached to the hole transport material. In the absence of the polar substituent groups, the hole transport material still is capable of hole transport. Thus, the polar substituent groups substantially do not affect the electronic properties of the hole transport material.

Typically, the hole transport material is soluble in common organic solvents in the absence of the polar substituents.

The presence of the polar substituent groups preferably substantially does not affect the electronic properties of the hole transport material. In other words the hole transporting capabilities of the material comprising the polar substituent groups preferably substantially are the same as the hole transporting capabilities of the equivalent material without the polar substituent groups.

Preferably, the hole transport material has a pH less than or equal to 3.

In the method according to the first aspect of the invention, the hole transport material preferably comprises a hole transport polymer. However, the material is not so limited and can be, for example, a small molecule, dendrimer or a metal complex.

When the hole transport material comprises a polymer, it desirably is a copolymer or higher order polymer (e.g. terpolymer). Thus, the polar substituent groups can be present on all or on only some of the repeat units. The hole transport polymer preferably comprises a repeat unit comprising an aryl or heteroaryl group. Preferably, the aryl or heteroaryl group is in the polymer backbone.

Still further, in the method according to the first aspect of the invention, in some embodiments, the hole transport material preferably is conjugated. In the case of a polymer, in these embodiments, the polymer preferably is partially or fully conjugated along the polymer backbone.

It is preferred that there is a break in the conjugation between each polar substituent group and the conjugated segment or segments of the material. This helps to minimise the effect of the polar substituent groups on the electronic properties of the material. To this end, a spacer group may be introduced between a polar substituent group and the conjugated segment or segments of the material. Suitable spacer groups (x and x') comprise saturated hydrocarbyls such as $(CH_2)_n$ where n is in the range of from 1 to 5, preferably in the range of 1 to 3.

When the hole transport material comprises a polymer, it is preferred that the polar substituent groups are not in conjugation with the polymer backbone. It is preferred that the polar substituent groups are comprised in side chains or side groups pendant from the backbone of the polymer. Each side chain or side group may comprise one or more, for example two, polar substituent groups.

Preferred spacer groups include aryl and heteroaryl groups such as phenyl; alkyl groups, for example $(CH_2)_n$ where n is from 2 to 10, preferably 2 to 4; alkoxy groups, for example $O(CH_2)_{n'}$ where n' is from 2 to 10, preferably 4; perfluoroalkyl groups, for example $(CF_2)_{n2}$ where n2 is from 2 to 10; and perfluoroalkoxy groups, for example $O(CF_2)_{n3}$ where n3 is from 2 to 10.

In one embodiment, a conjugated spacer group is preferable, for example a spacer group comprising an aryl or heteroaryl group, such as phenyl. In this embodiment, each aryl or heteroaryl group can carry one or more (for example two) polar substituent groups.

A preferred hole transport polymer is a fluorene-containing polymer in which all or a proportion of the fluorene groups carry the polar substituent groups.

Other preferred aryl and heteroaryl repeat units to be present in the polymer are those comprising a group selected from a spirofluorene, indenofluorene, p-linked dialkyl phenylene, a p-linked disubstituted phenylene, a phenylene vinylene, a 2,5-linked benzothiadiazole, a 2,5-linked substituted benzothiadiazole, a 2,5-linked disubstituted benzothiadiazole, a 2,5-linked substituted or unsubstituted thiophene or a triarylamine. These groups can be used to further tune the processing properties of the polymer and optionally can carry non-polar and/or polar substituent groups.

Preferably, the hole transporting polymer comprises triarylamine repeat units. More preferably, it is a copolymer comprising a first, arylene, repeat unit and a second, triarylamine, repeat unit.

Preferably each of the polar substituents is bound to a first, arylene, repeat unit.

Suitable triarylamine repeat units are selected from repeat units of formulae 7-12:

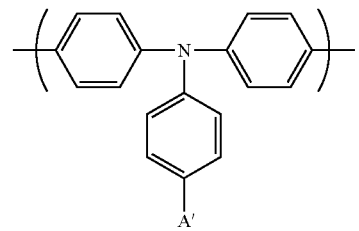

7

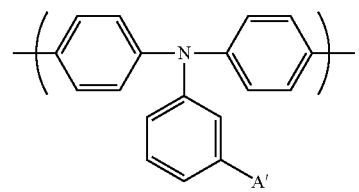

8

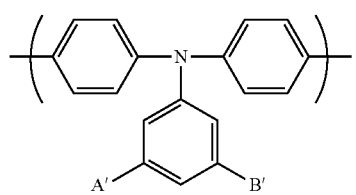

9

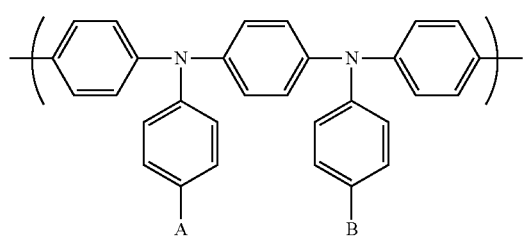

10

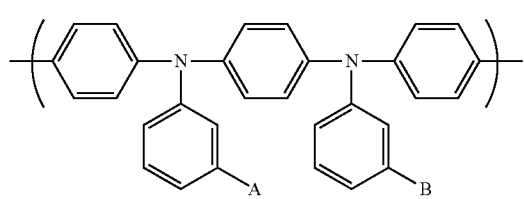

11

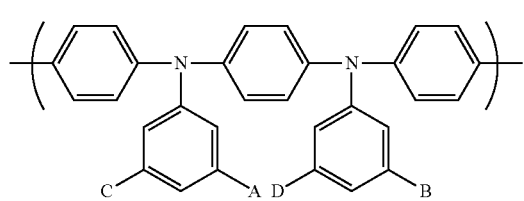

12

Wherein A', B', A, B, C and D are independently selected from H or a substituent group. More preferably, one or more of A', B', A, B, C and D is independently selected from the group consisting of alkyl, aryl, perfluoroalkyl, thioalkyl, cyano, alkoxy, heteroaryl, alkylaryl and arylalkyl groups. Most preferably, A', B', A and B are C1-10 alkyl. One or more phenyl groups of repeat units 7 to 12 may optionally be linked.

Preferably, the hole transporting material has a HOMO level in the range of about 4.8-5.5 eV.

Referring to the polar substituent groups, the number and nature of polar substituent groups will affect the ultimate solubility of the hole transport material. Where the hole transport material is a polymer, in a selected proportion of the monomers used to make the polymer, each monomer comprises at least one polar substituent group. Preferably for about 5 to 90%, more preferably 30-50%, of the monomers, each monomer contains at least one polar substituent group. For each monomer containing at least one polar substituent group, the residue of the monomer that is incorporated into the polymer as a repeat unit will contain the at least one polar substituent group. Each repeat unit may comprise one or more polar substituent groups. In the case of an AB copolymer it is preferred that one of the repeat units (A or B) comprises one polar substituent group (i.e. the proportion of repeat units comprising a polar substituent group equals 50%).

The polar substituent groups may be charged or neutral. Examples of units comprising (a) neutral and (b) charged and polar substituent groups are set out below.

(A) Neutral Polar Substituent Groups

Preferred neutral polar substituent groups are hydrophilic groups. Even more preferred neutral polar substituent groups are non-labile hydrophilic groups. These groups have the advantage that small leaving groups will not break from the polar group in the system. Such free leaving groups can have detrimental effects on device performance.

It is to be noted that the presence of non-polar and/or hydrophobic substituent groups in the hole transport material is not precluded. On the contrary, the presence of non-polar and/or hydrophobic substituent groups can further tune the processing properties of the hole transport material.

Preferred neutral polar substituent groups independently can be selected from aliphatic or alicyclic oxygen-, nitrogen-, sulphur- and phosphorous-containing groups known in the art. For example oxygen-containing groups include ether (particularly polyether), ester and aldehyde (including polyaldehyde). Nitrogen-containing groups include amine (primary, secondary and tertiary), cyano, amide, and imine. Polyamines are preferred. Sulphur-containing groups include thiophene, thiol, and mercapto. Phosphorous-containing groups include phosphine and phosphazene.

Particularly preferred polar groups include groups containing an oxygen or nitrogen atom.

Preferred polar groups are amines, in particular cyclic amines, such as morpholine; and ethers comprising at least 3 oxygen atoms. Other preferred polar groups include non-conjugated pyridines, such as alkyl pyridines.

A neutral polar substituent group may become charged in situ, after deposition of the hole transport layer, thus becoming a charged polar substituent group.

In one embodiment it is preferred for the polar substituent groups (either charged or neutral) to be present as substituents at the 9 position of fluorene repeat units of the type described in WO 02/092723.

An example of a fluorene-containing polymer comprises a repeat unit comprising general formula 1:

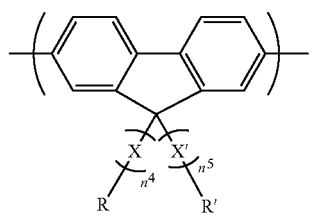

1 where x and x' are optional spacer groups as defined anywhere herein; R and R' are polar substituent groups and n4 and n5 each independently is in the range of from 0 to 10, preferably 0 to 5.

In one embodiment it is preferred that at least one of x and x' comprises at least one substituted or unsubstituted aryl or heteroaryl group. In this regard, reference is made to WO 02/092723.

In general formula 1, x and x' may represent phenyl.

In general formula 1, R and R' may independently represent oligoether.

For neutral polar substituent groups, it is preferred that R and R' each independently comprises a unit of formula:

R"O—(CH2CH2O)*p*- wherein R" is H or an optionally substituted hydrocarbyl group, preferably an alkyl, phenyl or alkylphenyl group and p is at least 2.

Examples of groups having general formula 1 are shown below in formulae 2 to 6b:
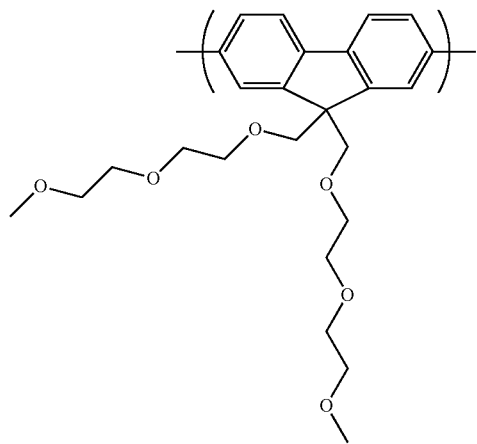
(2)
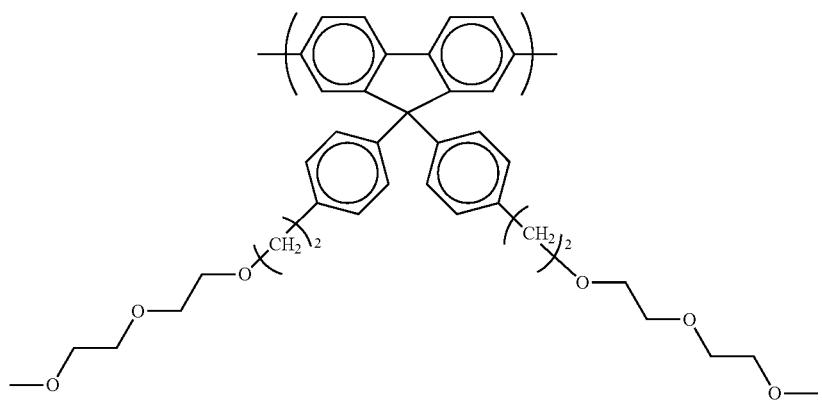
(3)
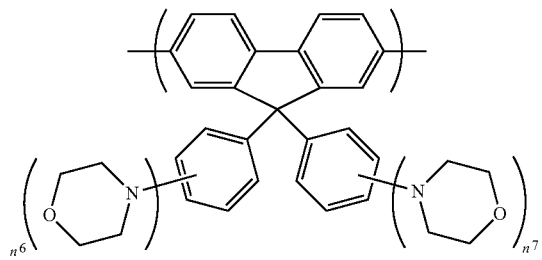
(4)
where n6=1 or 2, n7=1 or 2.

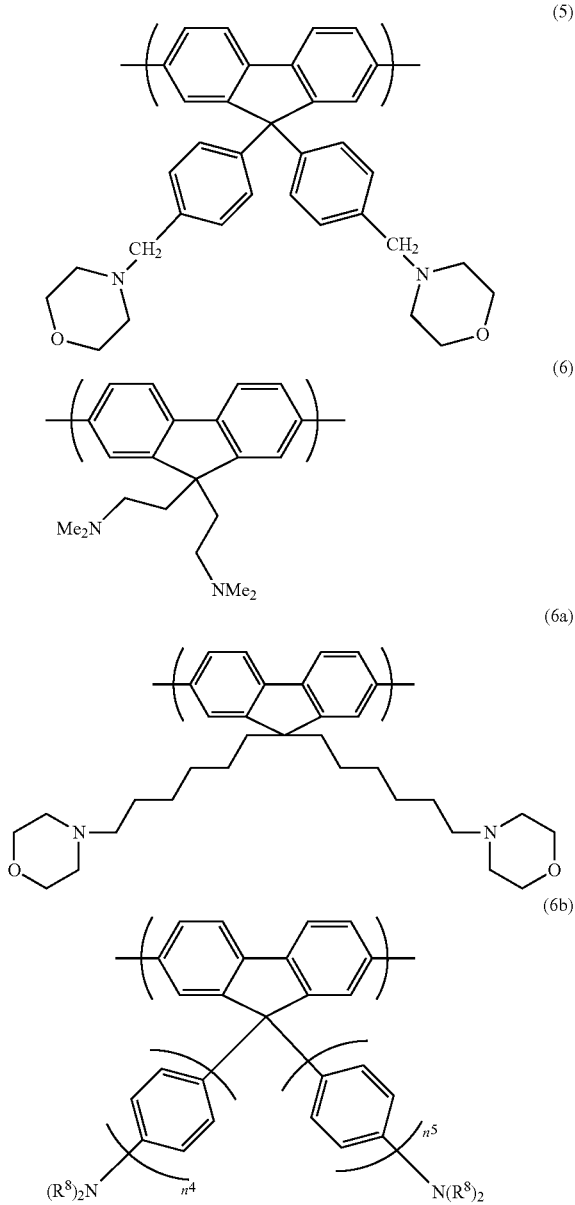

where n4 and n5 are as defined anywhere herein and each R8 independently represents alkyl, preferably C1 to C10 alkyl, more preferably methyl.

(B) Charged Polar Substituent Groups

Preferably the charged polar substituent groups contained in the hole transport polymer comprise a plurality of groups XY with a high dissociation constant such that each group effectively is ionised completely ($X^{\ominus}Y^{\oplus}$). Typically, group XY enhances the water solubility of the composition.

Preferably, XY is a group having a dissociation constant of greater than 10-12. XY may represent a strong acid or a salt.

Suitable polar groups further include acid groups; alcohols (including polyalcohols); and aldehydes (including polyaldehydes).

XY may represent —SO3Y. Counterion Y may be H (i.e. sulfonic acid), or a metal cation, in particular K or Na.

XY may represent a carboxylic acid or an acrylic acid.

Y may represent a quarternized or protonated non-conjugated pyridine.

XY may represent a quaternized salt; for example having formula

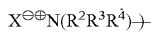

where X represents an anion such as a halide, preferably Br or tetrafluorborate BF4- or hexafluorophosphate PF6-. R2, R3 and R4 independently represent alkyl, preferably C1 to C10 alkyl, more preferably methyl.

A preferred quaternized salt is $-(\oplus N)Me_3 Br^{\ominus}$.

XY may comprise a protonated amine, for example amine protonated by sulfonic acid such that Y represents a sulfonate ion.

X may represent a charged sulphur-containing group, in particular sulfonate, sulfate, sulfite and sulfide.

X may represent a charged phosphorus-containing group, in particular phosphate.

In a preferred embodiment, the substituent XY is provided as a substituent R or R' in a polymer comprising a repeat unit of general formula 1 above.

As stated above, the number and nature of polar substituent groups will affect the ultimate solubility of the hole transport material. In some cases, neutral polar substituent groups may render the hole transport material soluble in polar solvents without rendering it substantially insoluble in non-polar solvents. It is therefore preferred that the hole transport material according to the first aspect of the invention is rendered substantially insoluble in the non-polar solvent by substitution of the polar solvent with a charged polar substituent group. It will be appreciated that the extent of solubility of any material in polar or non-polar solvents may readily be determined by solubility experiments.

When the hole transport material comprises a polymer, said polymer may comprise regions, each region having a HOMO energy level and a LUMO energy level that are distinct from the HOMO and LUMO energy level of the other regions. In view of the distinct HOMO and LUMO energy levels, each region is functionally distinct.

The hole transport polymer may contain one or more hole transport regions. The hole transport polymer or a hole transport region in the hole transport polymer preferably has a HOMO energy level of at least 4.8 eV, more preferably in the range 4.8 to 6 eV, still more preferably in the range 4.8 to 5.5 eV.

The hole transport polymer preferably comprises an aryl or heteroaryl repeat group Ar. The aryl or heteroaryl repeat groups may be present in the polymer backbone. The aryl or heteroaryl repeat groups may be present in side groups pendant from the polymer backbone. When Ar is present in a side group that is pendant from the polymer backbone, the side group may be attached to a non-conjugated or conjugated region in the polymer backbone.

The backbone of the hole transport polymer may have regions of conjugation. The regions of conjugation may be broken by regions of non-conjugation. The backbone may be fully conjugated or fully non-conjugated. A conjugated region consists of one or more conjugated groups in the backbone. A non-conjugated region consists of one or more non-conjugated groups in the backbone.

The polar substituent groups may be pendant from a non-conjugated region of the polymer backbone.

The polar substituent groups may be pendant from a conjugated region of the polymer backbone.

Preferably, when the hole transport material comprises a polymer, the polar substituent groups are present as substituents on side groups pendant from the polymer backbone.

Ar repeat groups in the hole transport polymer advantageously can be functional repeat groups in the polymer. In other words, the Ar repeat groups may give rise to the hole transporting properties of the polymer. When the Ar repeat groups are present in the polymer backbone they may give rise to hole transporting properties along the backbone.

The Ar repeat groups in the hole transport polymer may give rise to emissive properties.

Ar may represent any suitable aryl or heteroaryl group. Ar may represent an optionally substituted hydrocarbyl aryl group, in particular fluorene (particularly 2,7-linked fluorene), spirofluorene, indenofluorene, phenylene, or phenylenevinylene. Ar may represent an optionally substituted heteroaryl group, in particular thiophene or benzothiadiazole. Ar may represent an optionally substituted (e.g. alkylated) triarylamine group, in particular triphenylamine. Ar may represent an optionally substituted carbazole group. Ar may be selected according to desired charge transport and/or emissive properties for the hole transport polymer.

Ar may be substituted. Examples of substituents include solubilising groups; electron withdrawing groups such as fluorine, nitro or cyano; and substituents for increasing glass transition temperature (Tg) of the polymer.

In order to confer hole transporting properties on the polymer, it is preferred that Ar comprises an optionally substituted triarylamine or an optionally substituted carbazole.

In one embodiment, the hole transport polymer contains a repeat side group comprising formula 13:

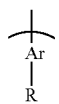

(13)

where Ar represents an aryl or heteroaryl group and R represents a polar substituent group as defined anywhere herein.

The polar substituent group R may be charged or neutral. Where R is a charged polar substituent group, the hole transport polymer may comprise a repeat side group comprising formula 14:

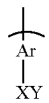

(14)

where Ar represents an aryl or heteroaryl group and XY represents a group with a high dissociation constant, such that it effectively is ionised completely ($X^{\ominus}Y^{\oplus}$):

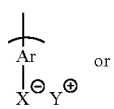

(15)

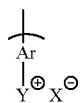

(16)

Ar in formula 13 may represent phenyl or biphenyl. The repeat side group may comprise formula 17 or 18:

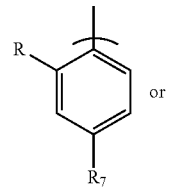

(17)

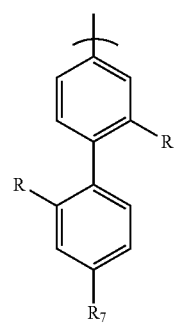

(18)

where R represents a polar substituent group as defined anywhere herein and R7 represents H or a substituent group. Examples of substituents include solubilising groups such as C1-20 alkyl or alkoxy; electron withdrawing groups such as fluorine, nitro or cyano; and substituents for increasing glass transition temperature (Tg) of the polymer.

In formula 17 and 18, R preferably represents XY.

Ar in formula 13 may represent triphenylamine. The repeat side group may comprise formula 19:

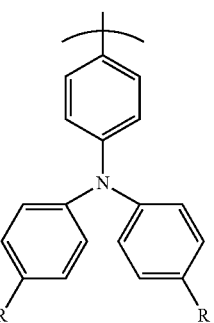

(19)

where R represents a polar substituent group as defined anywhere herein. Preferably R represents XY.

In one embodiment, the repeat side group is pendant from a non-conjugated group in the backbone. For example, the hole transport polymer may comprise a repeat unit of formula 20:

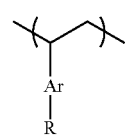

(20)

where the side group Ar—R is as defined anywhere herein, for example as shown in formula 21 or formula 22:

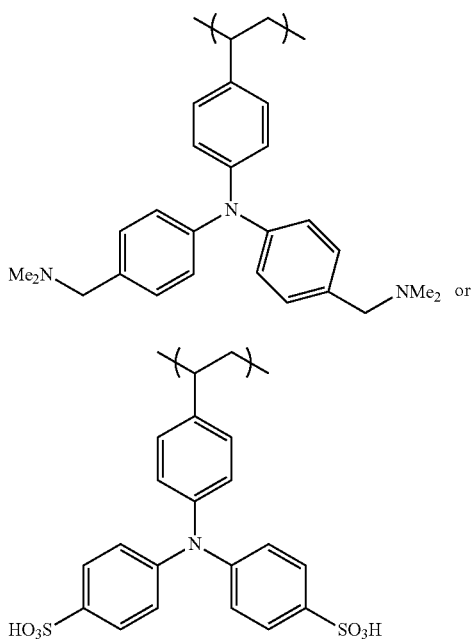

(21)

(22)

The hole transport polymer may comprise a copolymer comprising a first repeat unit as shown in any one of formulae 20 to 22 and a second repeat. The second repeat unit may have formula 23 or 24:

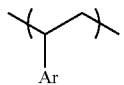

(23)

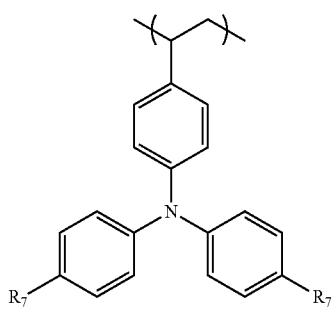

(24)

where R7 represents H or a substituent group. Examples of substituents include solubilising groups such as C1-20 alkyl or alkoxy; electron withdrawing groups such as fluorine, nitro or cyano; and substituents for increasing glass transition temperature (Tg) of the polymer.

Polymers with a part or the whole of the backbone being non-conjugated may be formed by polymerising the repeat units, which form non-conjugated segments of the backbone, through an unsaturated group attached to the repeat unit, for example an acrylate group or a vinyl group. The unsaturated group may be separated from the functional repeat unit by a spacer group. Polymers of this type are disclosed in, for example, WO 96/20253.

In one embodiment, the hole transport polymer comprises a repeat unit comprising general formula 25 or 26:

(25)

where Ar represents an aryl or heteroaryl group; x represents an optional organic spacer group and R represents a polar substituent group.

(26)

where Ar represents an aryl or heteroaryl group; x represents an optional organic spacer group and XY represents a group with a high dissociation constant, such that it effectively is ionised completely ($X^{\ominus}Y^{\oplus}$):

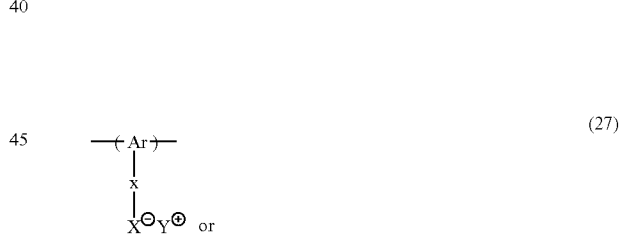

(27)

(28)

In this embodiment the side groups comprising XY will be pendant from a conjugated region of the polymer backbone.

The spacer group x may be as defined anywhere herein. x may comprise a group which breaks the conjugation between R (or XY) and Ar.

x may be substituted with more than one R (or XY) groups, for example two R (or XY) groups.

Ar in formulae 25 to 28 may represent an aryl or heteroaryl group defined anywhere herein.

Ar in formulae 25 to 28 may represent biphenyl. A repeat unit comprising formula 25 may comprise formula 29:

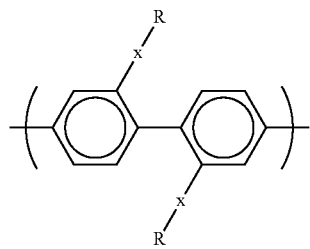

(29)

where R and x are as defined anywhere herein. Preferably R represents XY.

Preferably there is no spacer group x, giving formula 30 or 31:

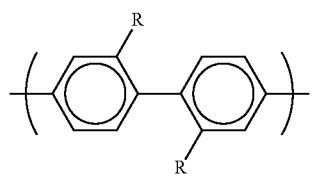

(30)

where R is as defined anywhere herein. Preferably R represents XY.

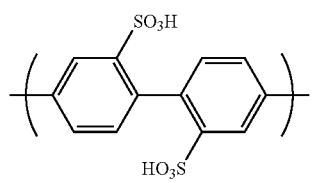

(31)

Ar in formulae 25 to 28 may represent fluorene. A repeat unit comprising formula 25 may comprise formula 32 or 33:

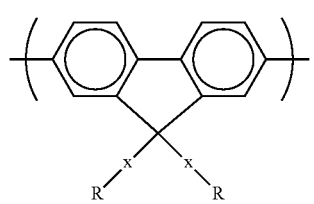

(32)

where x and R are as defined anywhere herein. Preferably R represents XY.

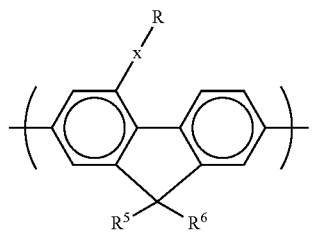

(33)

where x and R are as defined anywhere herein and R5 and R6 represent H or a substituent group. Examples of substituents include solubilising groups such as C1-20 alkyl or alkoxy; electron withdrawing groups such as fluorine, nitro or cyano; and substituents for increasing glass transition temperature (Tg) of the polymer. Preferably R represents XY.

Preferably the spacer groups x are present in formulae 32 and 33.

A repeat unit having formula 25 may comprise one of formulae 2 to 6a shown above or formulae 34 to 40a:

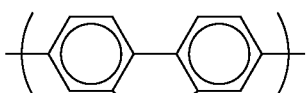

(34)

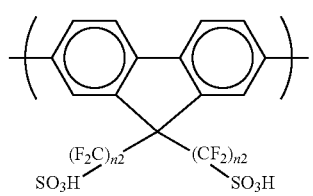

(35)

where n2 is as defined above.

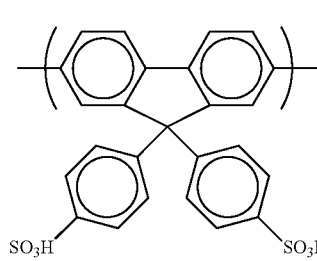

(36)

(37)

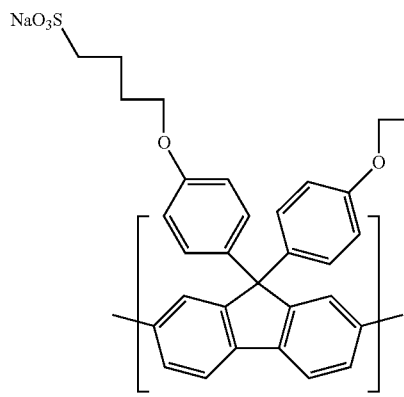

(40a)

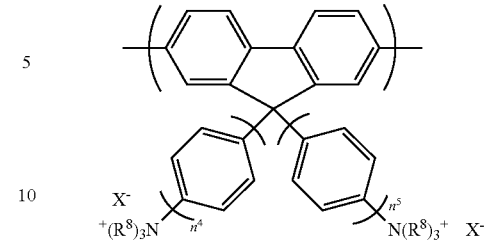

where counterions X are as defined anywhere herein; n4 and n5 each independently is in the range of from 0 to 10, preferably 0 to 5; and each R8 independently represents alkyl, preferably C1 to C10 alkyl, more preferably methyl.

Ar in formulae 25 to 28 may represent phenyl. A repeat unit comprising formula 25 may comprise formula 41:

(38)

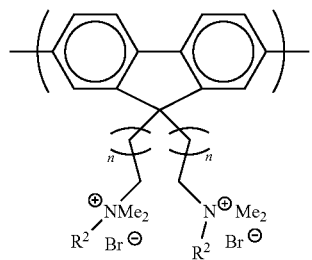

where R2 and n are as defined above.

(41)

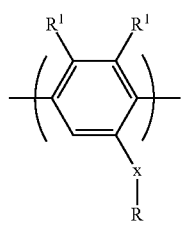

where x and R are as defined anywhere herein and R1 represents H or a substituent group. Examples of substituents include solubilising groups such as C1-20 alkyl or alkoxy; electron withdrawing groups such as fluorine, nitro or cyano; and substituents for increasing glass transition temperature (Tg) of the polymer. Preferably R represents XY.

For example, a repeat unit comprising formula 25 may comprise formula 42:

(39)

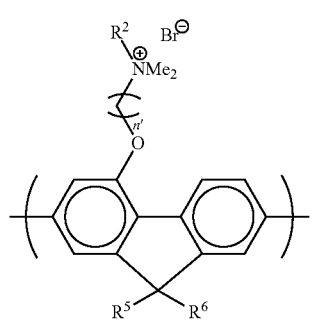

where R2, R5, R6 and n' are as defined above.

(42)

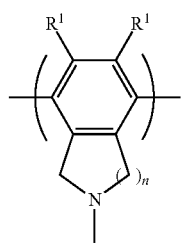

(40)

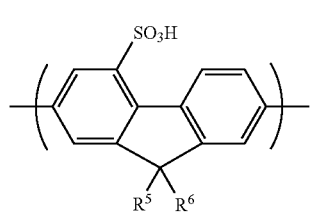

where R5 and R6 are as defined above.

where R1 is as defined in relation to formula 41 and n is as defined above.

A repeat unit comprising formula 25 may comprise formula 43:

(43)

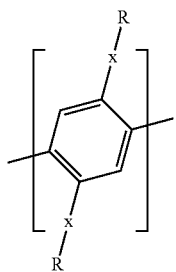

where x and R are as defined anywhere herein. Preferably R represents XY.

For example, a repeat unit comprising formula 25 may comprise formula 44:

(44)

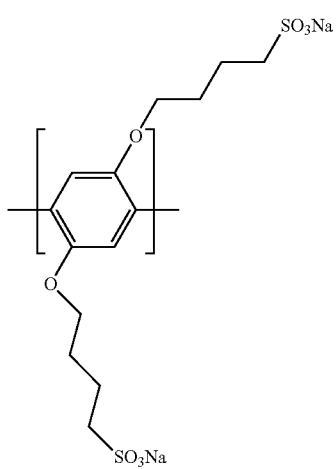

Ar in formulae 25 to 28 may represent triphenylamine. A repeat unit comprising formula 25 may comprise formula 45:

(45)

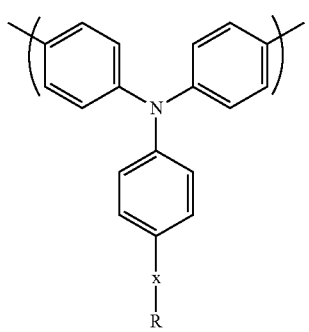

where x and R are as defined anywhere herein. Preferably R represents XY.

For example, a repeat unit comprising formula 25 may comprise formula 46, 47 or 48:

(46)

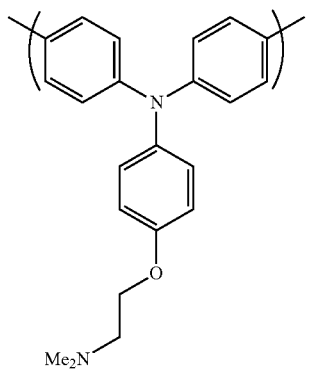

(47)

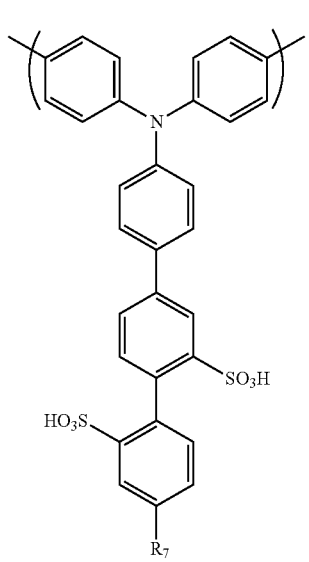

(48)

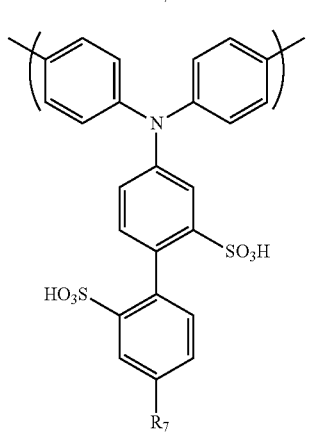

where $R_7$ represents H or a substituent group. Examples of substituents include solubilising groups such as C1-20 alkyl or alkoxy; electron withdrawing groups such as fluorine, nitro or cyano; and substituents for increasing glass transition temperature (Tg) of the polymer.

x in formula 45 may represent phenyl or biphenyl.

In addition to the repeat unit of formula 25, the polymer may contain one or more further aryl or heteroaryl repeat units. This further repeat unit may be selected to tune the charge transporting and/or emissive properties further. For example, the polymer may comprise a triarylamine repeat unit to aid hole transport.

The triarylamine repeat unit may be selected from formulae 7 to 12 as defined above.

Desirably the hole transporting polymer may comprise a triarylamine repeat unit and a fluorene repeat unit. The polymer may be an AB copolymer.

The hole transport polymer as defined anywhere herein may comprise a fluorene repeat unit comprising formula 50:

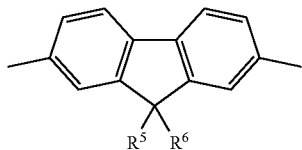
(50)

wherein R5 and R6 are independently selected from hydrogen or optionally substituted alkyl, alkoxy, aryl, arylalkyl, heteroaryl and heteroarylalkyl. More preferably, at least one of R5 and R6 comprises an optionally substituted C4-C20 alkyl or aryl group. Most preferably, R5 and R6 represent n-octyl.

The hole transport polymer may comprise a triarylamine repeat unit; a first fluorene repeat unit of one of formulae 1 to 6b or 32 to 40a; and optionally a second fluorene repeat unit as defined anywhere herein. A preferred ratio of triarylamine repeat unit:first fluorene repeat unit:second fluorene repeat unit is 50:30:20.

The hole transport polymer may comprise a triarylamine repeat unit as defined anywhere herein and a biphenyl repeat unit of one of formulae 29 to 31.

The hole transport polymer may comprise fluorene repeat unit as defined anywhere herein and a phenyl repeat unit of one of formulae 41 to 44.

The hole transport polymer may comprise a linear polymer. Preferably at least 5 mol % of the repeat units in the linear polymer are conjugated along the polymer backbone.

The hole transport polymer may have formula 51:

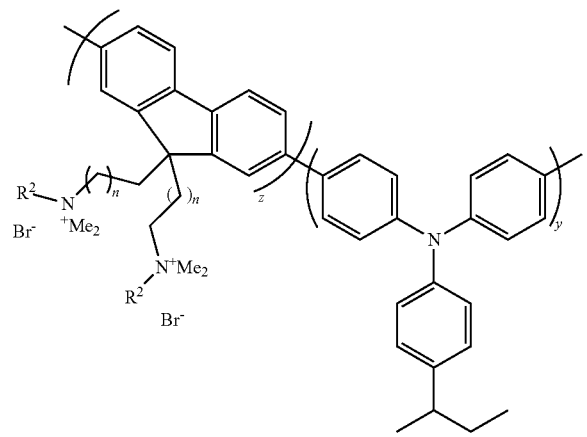
(51)

where R2 and n are as defined above.+

The hole transport polymer of formula 51 is derivable from a polymer having formula 52:

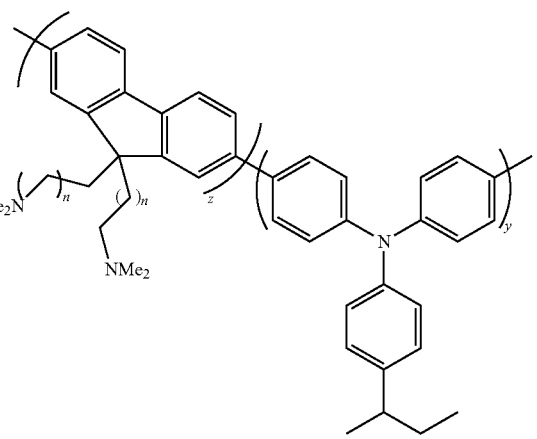
(52)

where n is as defined above.

The polymer having formula 52 may be prepared by copolymerising monomer (2):

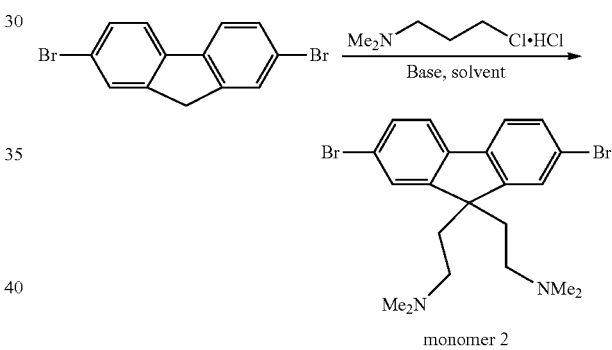

monomer 2

The hole transport polymer may have formula 53:

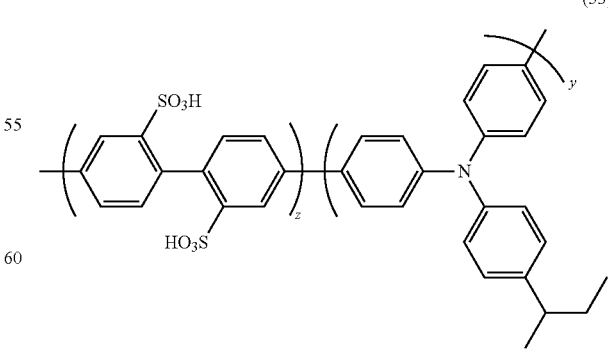
(53)

The hole transport polymer having formula 53 may be prepared by copolymerising monomer (4):

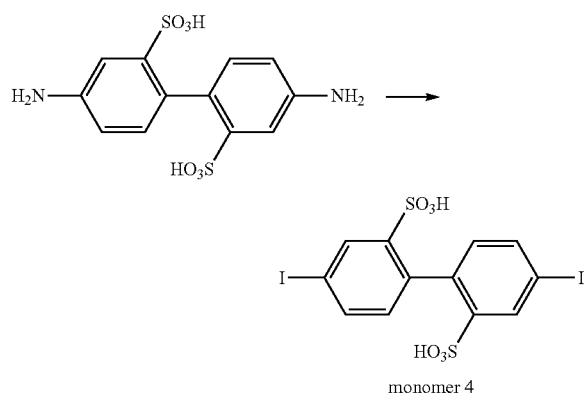

monomer 4

The hole transport polymer may have formula 54:

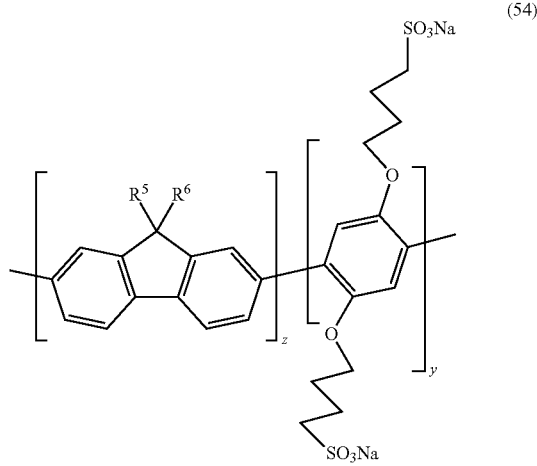

where R5 and R6 are as defined above in relation to formula 50.

The sulphonate containing monomer can be made according to the method in Macromolecules 1998, 31, 964-974, with appropriate modifications for the O(CH2)4SO3Na side groups in place of O(CH2)3SO3Na.

The hole transport polymer may comprise a dendrimer. A dendrimer is a tree-like polymer, which comprises dendron(s) emanating from a central core. Usually there are at least three dendrons. A dendron comprises a branched unit. The branched unit may be a repeat unit in the dendron. Each dendron comprises a backbone. Side groups may be pendant from the backbone.

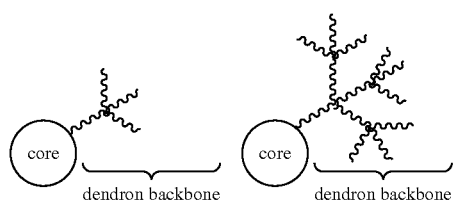

dendron backbone     dendron backbone

The core of the dendrimer may comprise formula 55 or 56:

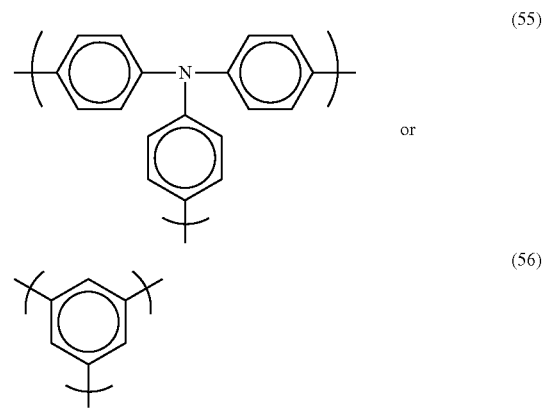

Each dendron may comprise a triarylamine repeat unit as defined anywhere herein. Each dendron may comprise a triarylamine repeat unit and a fluorene repeat unit as defined anywhere herein. Each dendron may comprise a thiophene repeat unit, optionally together with a triarylamine and/or fluorene repeat unit.

The nature and number of polar substituents are preferably selected such that the hole transport material is soluble in a solvent having a dielectric constant at 20° C. of greater than 15, more preferably in the range 20-50. Dielectric constants of common solvents may be found in the CRC Handbook of Chemistry and Physics, 82nd Edition, page 8-127.

Examples of suitable polar solvents include water; C1-6 alcohols, preferably methanol, ethanol or propanol; dimethyl sulfoxide; and dimethylformamide. Further examples of polar solvents will be apparent to the skilled person. It is sufficient for the hole transport material to be soluble in any one polar solvent so that the hole transport material can be deposited from solution in the polar solvent.

Turning to the second layer and the second material, preferable materials for the second material will depend upon the function of the layer of the material in the device (for example semiconductive, emissive layer; charge transport layer; insulating layer etc.). Suitable materials will be well-known to a person skilled in the art. Suitably, the second material is a polymer. However, the material is not so limited and can be, for example, a small molecule, dendrimer or a metal complex. Preferably, the second material is a light emissive material.

In the method according to the first aspect of the present invention, the second layer typically comprises the light emissive layer. As such, typically the emissive layer is deposited from a non-polar solvent.

Preferably, the second material comprises non-polar substituents for solubilising the second material in a non-polar solvent. Preferred non-polar substituents include C1-20 alkyl and alkoxy groups.

The non-polar solvent preferably is a common organic solvent. Preferred non-polar solvents are those having a dielectric constant at 20° C. of less than 10, more preferably less than 5, most preferably less than 3. Examples of such solvents are benzene and mono- or polyalkylated benzene, in particular xylene and toluene.

Suitable techniques for solution processing the hole transport material and the second material will be well known to those skilled in this art. Preferred techniques include ink-jet printing and spin coating and roll printing.

Other materials can be present with the hole transport material in the solution. In this regard, it may be necessary to control the processing properties of all of the materials in the solution by introducing polar substituent groups.

In the method according to the first aspect of the present invention, the electronic device preferably comprises a light-emitting device (LED).

Where the device is an LED, the LED will have an anode, a cathode and a light emissive layer located between the anode and the cathode. The anode may be, for example, a layer of transparent indium tin oxide. The cathode may be, for example, LiAl. Holes and electrons that are injected into the device recombine radiatively in the light emissive layer. The hole transport layer is located between the anode and the light emissive layer. Optionally, a hole injection layer, such as a layer of polyethylene dioxythiophene (PEDT), may be present between the hole transport layer and the anode. This provides an energy level which helps the holes injected from the anode to reach the hole transport layer and the light emissive layer.

The LED also may have an electron transport layer situated between the cathode and a light emissive layer. This provides an energy level which helps the electrons injected from the cathode to reach the light emissive layer.

The light emissive layer can itself comprise a laminate, effectively made up of sub-layers.

The LED may have further layers in addition to those mentioned above. For example, the LED may have one or more charge or exciton blocking layers.

In one embodiment of the method according to the first aspect of the present invention, the hole transport material comprises a hole transport polymer as defined anywhere herein and the second material comprises a second polymer. The hole transport polymer may comprise a repeat unit comprising an aryl or heteroaryl group. The second polymer may comprise a repeat unit comprising an aryl or heteroaryl group, which is the same as the aryl or heteroaryl group comprised in the repeat unit of the hole transport polymer. The aryl group or heteroaryl group can be differently substituted however in the hole transport polymer as compared with the second polymer. Preferred aryl and heteroaryl groups are as discussed above.

The method according to the first aspect of the present invention may comprise the further step of forming a third layer of the device. It will be understood that advantageously, the step of forming the third layer can be carried out whilst the second material remains soluble in the second solvent. Thus, there is no need to crosslink the second material after deposition.

The third layer of the device can be formed by depositing over the second material a third material from solution in a third solvent in which the second layer is substantially insoluble. The third solvent is a polar solvent, which may be the same or different as the polar solvent used to deposit the hole transport layer. Polar substituent groups are present on the third material so that the third material is soluble in the polar solvent. The second layer is substantially insoluble in the polar solvent used to deposit the third material. Preferred polar substituent groups for the third material are as discussed above in relation to the hole transport material.

Knowing the function of the second layer in the device, the skilled person will know a desirable function for the third layer and thus will know suitable materials for selection as the third material. The third material preferably comprises a polymer. However, the material is not so limited and can be, for example, a small molecule, dendrimer or a metal complex. Preferably, the third layer is a polar electron transport layer.

The first aspect of the invention further provides a semiconductive hole transport material containing polar substituent groups, the hole transport material being soluble in a polar solvent. The hole transport material may be as defined anywhere above in relation to the first aspect of the present invention.

The first aspect of the invention still further provides the use of the aforementioned semiconductive hole transport material in a method for forming an organic electronic device. The first aspect still further provides an organic electronic device containing a hole transport layer, the hole transport layer comprising the aforementioned semiconductive hole transport material for transporting holes in the device.

The first aspect of the invention further provides an organic electronic device obtained or obtainable by the method according to the first aspect of the present invention. The device includes a hole transport layer comprising a hole transport material, said hole transport material containing polar substituent groups selected so that the hole transport material is soluble in a polar solvent. Preferred features of the device are as discussed anywhere above in relation to the method according to the first aspect of the present invention.

Finally, the first aspect of the invention provides a method of manufacturing a semiconductive hole transport polymer containing polar substituent groups, the polymer being as described anywhere above in relation to the first aspect of the present invention. The hole transport polymer may first be prepared in precursor form.

Preferred methods for preparation of the semiconductive hole transport polymer are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

Repeat units and end groups comprising aryl groups as illustrated throughout this application may be derived from a monomer carrying a suitable leaving group(s).

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include tosylate, mesylate, phenyl sulfonate and triflate.

Monomers for preparing a polymer according to the method of the second aspect may comprise formula 57 or 58:

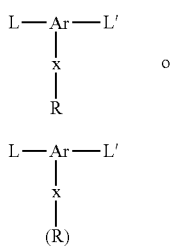
(57)
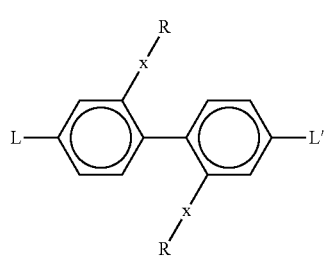
(58)
where Ar, x, and R are as defined anywhere above; L and L' are reactive groups suitable for participating in a polymerisation reaction; and (R) represents a precursor to R, which may be converted to R after polymerisation. Preferably R represents XY.
L and L' may represent Br.
Preferred monomers include those comprising the structure shown in one of formulae 59 to 83:
(59)
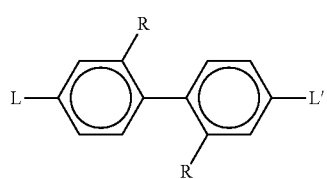
(60)
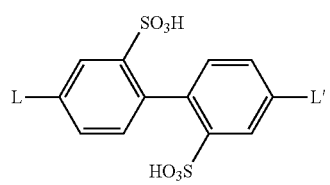
(61)
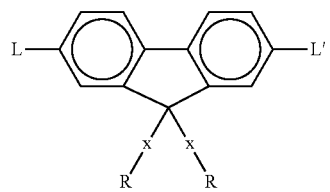
(62)
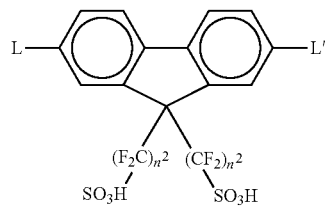
(63)
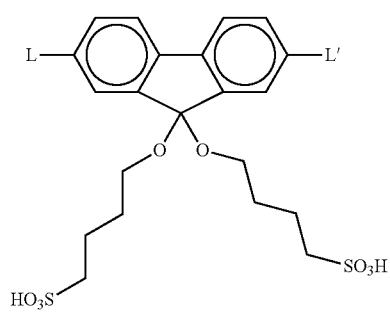
(64)
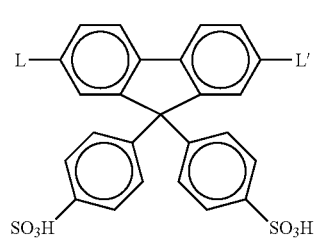
(65)
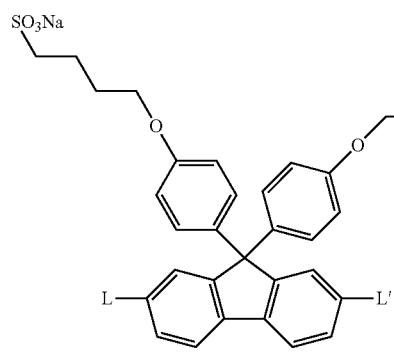
(66)

-continued
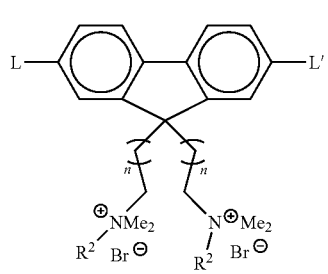 (67)
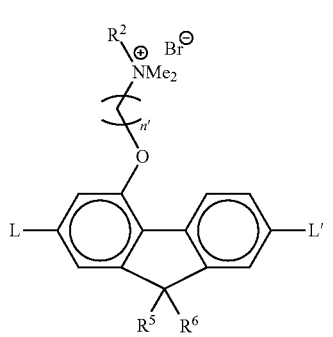 (68)
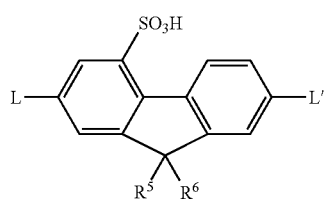 (69)
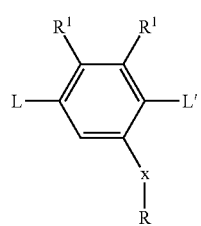 (70)
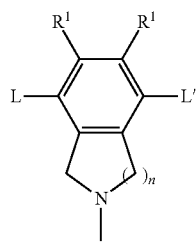 (71)
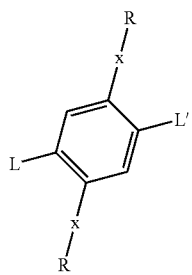 (72)
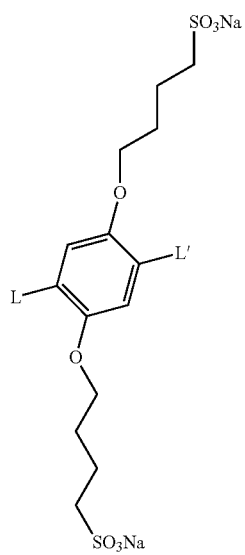 (73)
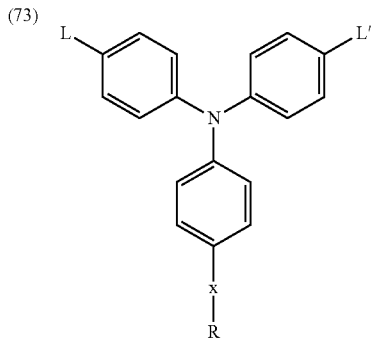 (74)

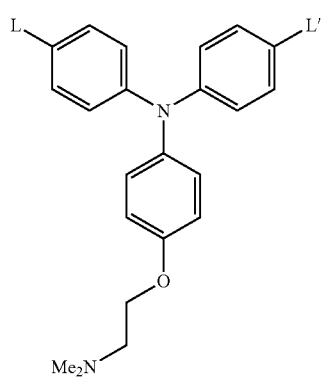
(75)
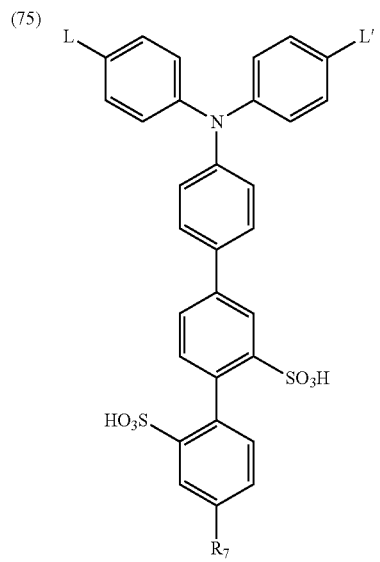
(76)
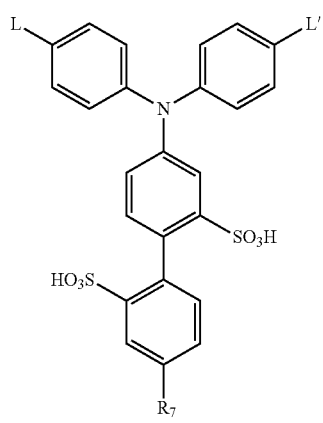
(77)
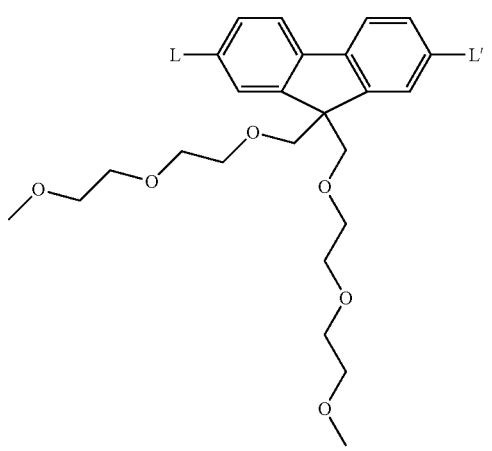
(78)
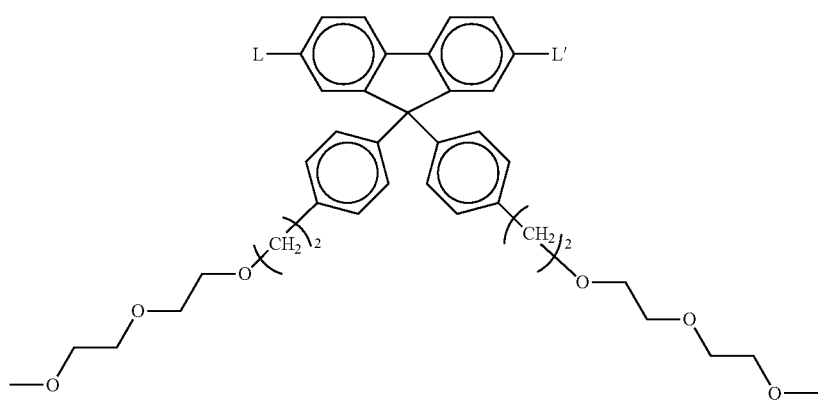
(79)

-continued

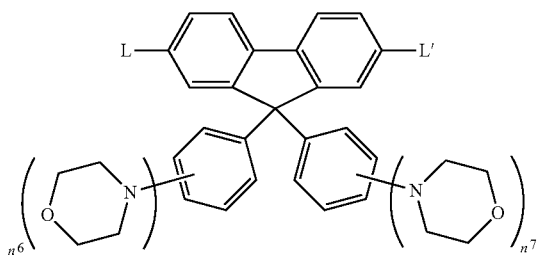
(80)

where n6=1 or 2, n7=1 or 2.

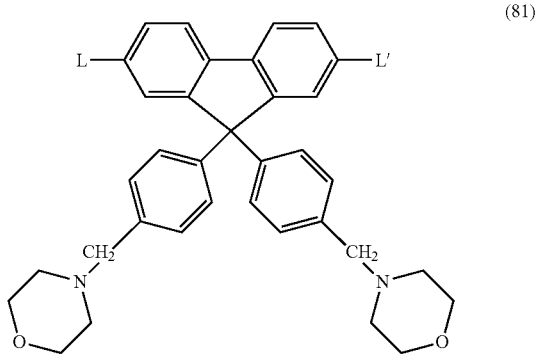
(81)

(82)

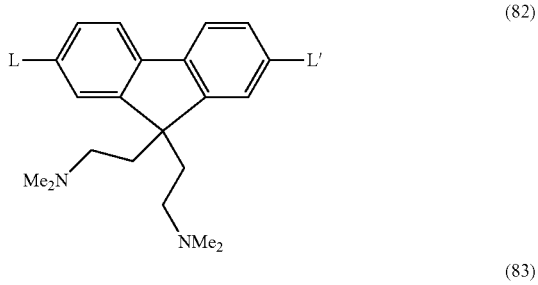
(83)

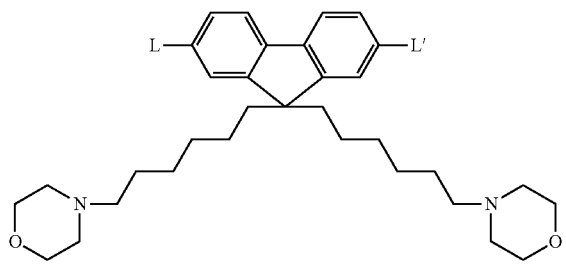

In any of the above formulae 59 to 83, R may be replaced by (R) as defined in relation to formula 58.

Polymers with a part or the whole of the backbone being non-conjugated may be formed by polymerising the repeat units, which form non-conjugated segments of the backbone, through an unsaturated group attached to the repeat unit, for example an acrylate group or a vinyl group. The unsaturated group may be separated from the functional repeat unit by a spacer group. Polymers of this type are disclosed in, for example, WO 96/20253.

Turning to the second aspect of the invention, since the invention provides a means for controlling the processing of materials, it is not necessary to select materials for use in the electronic device within the confines of those materials already having suitable processing properties. The disadvantages of having to select materials for use in the electronic device within the confines of those materials already having suitable processing properties have been discussed above with reference to the prior art. The present invention enables materials, which by design are soluble in polar solvents. Where the device contains a multilayer of polymers this leads to greater flexibility in the range of repeat units that can be used in the various polymers. For example, for adjacent polymer layers A and B in a device it is possible to select both polymer A and polymer B to contain a repeat unit comprising the same aryl or heteroaryl group. Polymer A and polymer B can both comprise a fluorene or triarylamine repeat unit for example. The processing properties of either polymer A or polymer B can be modified using polar substituent groups so that the polymers have different solubility behaviour.

Thus, in accordance with the second aspect, the invention is applied in the case where two materials that are to be deposited in adjacent layers of an electronic device have similar structures (e.g. polymers having the same or similar repeat units in the backbone). The invention allows the processing properties of one or other of the materials to be controlled so that they are not soluble in the same solvents. Thus, the second aspect provides a method for forming an organic electronic device, including the steps of:

depositing a first polymer from solution in a first solvent to form a first layer of the device; and subsequently forming a second layer of the device by depositing a second polymer from solution in which the first layer is substantially insoluble; where the solution containing the second polymer comprises a second solvent, and either the first solvent or the second solvent is a polar solvent; and where the first polymer or the second polymer contains polar substituent groups selected so that the first polymer or the second polymer is soluble in the polar solvent, the other of the first polymer and the second polymer being substantially insoluble in the polar solvent; and characterised in that the first polymer comprises a repeat unit Ar1 and the second polymer comprises a repeat unit Ar2. Ar1 and Ar2 comprise the same aryl or heteroaryl group, although the aryl or heteroaryl group may be differently substituted in Ar1 as compared with Ar2. In other words, Ar1 and Ar2 comprise a common aryl or heteroaryl group.

For optimising solution processing, particularly ink jet printing, a mixture of solvents may be present in the aforementioned solutions.

Advantageously, the step of forming the second layer can be carried out while the first polymer remains soluble in the first solvent. Thus, there is no need to crosslink the first polymer after deposition.

The polar substituent groups are covalently attached to the first or second polymer.

Preferred aryl and heteroaryl groups include fluorene, phenylene, phenylenevinylene, benzothiadiazole, thiophene, triarylamine, indenofluorene, and spirofluorene groups. A particularly preferred aryl or heteroaryl group for the method according to the second aspect is fluorene.

In the second aspect of the invention, preferably, the first layer is a hole transport layer. Further, preferably, the second layer is a light emissive layer and/or an electron transport layer.

In one embodiment of this preferred arrangement, the first polymer is a hole transporting polymer comprising polar substituent groups as discussed above in respect of the first aspect of the invention, and the second polymer is a light-emissive polymer deposited from a non-polar solvent solution. In some cases, neutral polar substituent groups may render the first polymer soluble in polar solvents without rendering it substantially insoluble in non-polar solvents. It is therefore preferred that the hole transporting polymer according to this embodiment is rendered substantially insoluble in the non-polar solvent by substitution with a charged polar substituent groups.

In another embodiment of this preferred arrangement, the first polymer is a hole transporting polymer that is substantially insoluble in polar solvents, and the second polymer is a light-emissive polymer deposited from a polar solvent solution. In this embodiment, it is preferred that the light-emissive polymer is rendered soluble in the polar solvent by substitution with neutral polar substituent groups because the presence of dissociating groups in the emissive layer as described for the charged polar substituents described above may result in doping of the emissive layer to the detriment of device performance.

The preferred number and nature of polar substituent groups contained in the first polymer or the second polymer are as discussed above in relation to the first aspect of the present invention with the proviso that it is not essential in the second aspect for the polymer containing polar substituent groups to be a hole transport polymer.

Preferably, whichever of the first polymer and the second polymer is substantially insoluble in the polar solvent comprises non-polar substituents for solubilising the material in a non-polar solvent.

Suitable techniques for solution processing the first polymer and the second polymer will be well known to those skilled in this art. Preferred techniques include ink-jet printing and spincoating.

Whichever of the first polymer and the second polymer is substantially insoluble in the polar solvent, preferably is deposited from solution in a non-polar solvent, more preferably a common organic solvent.

Preferable polymers for the first polymer and the second polymer will depend upon the function of the layer of the polymer in the device (for example emissive layer; charge transport layer; insulating layer etc.).

Referring to the polymer containing polar substituent groups, the polymer preferably is conjugated. The polymer preferably is partially or fully conjugated along the polymer backbone. It is preferred that there is a break in the conjugation between each polar substituent group and the conjugated segment or segments of the polymer. This helps to minimise the effect of the polar substituent groups on the electronic properties of the polymer. To this end, a spacer group may be introduced between a polar substituent group and the conjugated segment or segments of the polymer. Suitable spacer groups (x and x') comprise saturated hydrocarbyls, such as (CH2)n where n is in the range of from 1 to 5, preferably in the range of 1 to 3.

In one embodiment, a conjugated spacer group is preferable, for example a spacer group comprising an aryl or heteroaryl group, such as phenyl. In this embodiment, each aryl or heteroaryl group can carry one or more (for example two) polar substituent groups.

In one embodiment it is preferred that at least one of x and x' comprises at least one substituted or unsubstituted aryl or heteroaryl group. In this regard, reference is made to WO 02/092723. In one embodiment it is preferred for the proportion of polar substituent groups to be present as substituents on the aryl or heteroaryl groups at the 9 position of the fluorene repeat units described in WO 02/092723. Examples of preferred fluorene-containing polymers are provided above in relation to the first aspect of the present invention with the proviso that it is not essential in the second aspect for the polymer containing polar substituent groups to be a hole transport polymer.

Other preferred repeat units to be present in the first polymer and/or the second polymer in the second aspect of the present invention are those comprising a group selected from a p-linked dialkyl phenylene, a p-linked disubstituted phenylene, a phenylene vinylene, a 2,5-linked benzothiadiazole, a 2,5-linked substituted benzothiadiazole, a 2,5-linked disubstituted benzothiadiazole, a 2,5-linked substituted or unsubstituted thiophene or a triarylamine.

Typically, the polymer whose processing properties are controlled by the method of the second aspect of the present invention is soluble in common organic solvents in the absence of the proportion of polar substituents.

The method according to the second aspect of the invention may comprise the further step of forming a third layer of the device. The third layer of the device can be formed by depositing over the second polymer a third material from solution in a third solvent in which the second layer is substantially insoluble.

Advantageously, the step of forming the third layer can be carried out while the second polymer remains soluble in the second solvent. Thus, there is no need to crosslink the second polymer after deposition.

The third solvent may or may not be a polar solvent. If the first solvent is a polar solvent then the third solvent also will be a polar solvent, which may be the same as or different from the first solvent. Where the third solvent is a polar solvent, polar substituent groups are present on the third material so that the third material is soluble in the polar solvent. Preferred polar substituent groups for the third material are as discussed above.

Knowing the function of the first and second layers in the device, the skilled person will know a desirable function for the third layer and thus will know suitable materials for selection as the third material. The third material preferably comprises a polymer.

However, the third material is not so limited and can be for example a small molecule, dendrimer or a metal complex. Preferably, the first layer is a polar hole transport layer, the second layer is a non polar emissive layer, and the third layer is a polar electron transport layer.

The second aspect of the invention further provides an organic electronic device obtained or obtainable by the method according to the second aspect of the present invention. Preferred features of the device are as discussed anywhere above in relation to the first aspect of the present invention with the proviso that it is not essential in the second aspect for the polymer containing polar substituent groups to be a hole transport polymer or indeed for the device to contain a hole transport layer.

Development of the invention as discussed above has led to a third aspect of the invention. The third aspect of the invention is discussed below.

When a hole transport material contains polar substituent groups (as discussed in relation to the method according to the first aspect) then under certain conditions it is possible for the next layer of the device to be deposited from solution in a solvent in which the hole transport layer is otherwise soluble, without destroying the integrity of the hole transport layer. The present inventors have observed this effect when the hole transport material is deposited onto a layer of conducting material containing polar groups (e.g. PEDT/PSS).

Interaction between the polar substituents in the hole transport material and the polar groups in the conducting material stabilises the hole transport layer thus formed. In fact, this interaction allows the subsequent (typically emissive) layer to be deposited from solution in which the hole transporting polymer would otherwise dissolve. In other words, the hole transport material and subsequent layer material need not have different solubilities in a given solvent.

Therefore, a third aspect of the invention provides a method for forming an organic electronic device, including the steps of:

forming a conducting layer comprising a conducting material, said conducting material containing polar groups; and forming a hole transport layer comprising a semiconductive hole transport material on the conducting layer, characterised in that said hole transport material contains polar substituent groups.

In the method according to the third aspect, should it be desirable, the next (third) layer of the device, which is formed on the hole transport layer, can be deposited by processing from solution in a solvent in which the hole transport layer is soluble in the absence of the conducting layer. Alternatively, the next layer of the device may be formed on the hole transport layer in accordance with the method according to the first aspect of the present invention. The third layer comprises a third material. Suitable materials for the third layer are as defined above in relation to the second material discussed in relation to the first aspect of the present invention.

Typically, the hole transport material will contain polar substituent groups selected so that the hole transport material is soluble in a polar solvent. In this regard, preferred hole transport materials are as discussed above in relation to the first aspect of the present invention.

Any suitable conducting material containing polar groups can be used provided that a stabilising interaction is formed between the layer of the conducting material and the hole transport layer. Preferably, the conducting material comprises an organic conducting material. The presence of a stabilising interaction can be determined by testing whether the stabilised hole transport layer is substantially insoluble in a solvent in which it would otherwise be soluble. In fact, it has been discovered that in some cases a stabilising interaction can be formed even when the hole transport material does not contain polar substituent groups. Therefore, the third aspect of the present invention further provides a method for forming an organic electronic device, including the steps of:

forming a conducting layer comprising a conducting material; and forming a hole transport layer on the conducting layer by depositing a solution comprising a semiconductive hole transport material, characterised in that said hole transport material irreversibly binds to said conducting material to render the hole transport layer insoluble without substantially affecting the electronic properties of the hole transport material.

For optimising solution processing, particularly ink jet printing, a mixture of solvents may be present in the aforementioned solutions.

The hole transport material may be deposited from solution in a non-polar solvent. Alternatively, as discussed above, the hole transport material may be deposited from solution in a polar solvent.

In the context of the third aspect of the invention, the hole transport layer is rendered insoluble insofar as it is possible to deposit a solution of the next layer of the device on the hole transport layer, in which solution the hole transport material might otherwise be soluble in the absence of the binding interaction between the hole transport material and the conducting material. The irreversible binding interaction means that all of the hole transport layer can not be washed off using the same solvent that was used to deposit the hole transport material, even under forcing conditions, for example continuous washing until the thickness of the layer remains constant even with further washing. This allows the next layer of the device to be deposited without substantially affecting the integrity of the hole transport layer.

Preferably, an at least 10 nm thickness of hole transport layer remains after continuous washing.

Typically, the hole transport material comprises a hole transport polymer. In this case, preferably, side chains or side groups pendant from the backbone of the hole transport polymer form the stabilising, irreversible binding interaction with the conducting material. This has the benefit of decoupling the effects that the interaction could have on the electronic properties of the polymer. Preferably, the side chains or side groups which form the stabilising, irreversible binding interaction with the conducting material are not in conjugation with the polymer backbone.

In one embodiment no repeat unit in the backbone of the hole transport polymer irreversibly binds to the conducting material.

In one embodiment the hole transport polymer is not PVK. In one embodiment the hole transport polymer does not contain a fluorene repeat unit in the polymer backbone.

The nature of the stabilising, irreversible binding interaction may vary from system to system. Stabilising interactions that are capable of rendering the hole transport layer insoluble include protonation of the hole transport material by the conducting material; hydrogen bonds formed between the hole transporting material and the conducting material; and dipolar interactions between the hole transport material and the conducting material.

The hole transport material may contain polar substituent groups, as discussed above in relation to the first aspect of the invention.

The hole transport material may contain O or N. Preferably, the O or N atoms accept protons from the conducting material to form the irreversible binding interaction. In particular, the hole transport material may contain amine or morpholine groups, which may be protonated by a conducting material such as PEDT doped with a charge balancing dopant. The charge balancing dopant may be acidic. The charge balancing dopant may be a polyanion. Preferably the charge balancing dopant comprises a sulfonate, such as poly(styrene sulfonate) (PSS) where the PEDT conducting polymer is blended with acidic polar PSS groups. When the hole transport material comprises a hole transport polymer, the groups that are protonated by the conducting material preferably are pendant from the polymer backbone.

Generally, the stabilising, irreversible binding interaction between the hole transport material and the conducting material occurs spontaneously during deposition of the hole transport material on the conducting layer. However, the possibility of treating the hole transport layer after deposition is not excluded.

It may also be desirable to control the contact time between the solution comprising the semiconductive hole transport material and the conducting layer.

Of course, the electronic properties of the conducting material must be compatible with device performance, i.e. the conducting material should be capable of transporting holes from the anode to the hole transport layer.

The conducting material may contain polar groups.

Preferably, the conducting material comprises a conducting polymer.

The conducting material may comprise an organic conducting material such as a hole injecting material.

One particularly preferred organic conducting material comprises a hole injecting material, such as poly(ethylene dioxythiophene) (PEDT) doped with a charge balancing dopant. The charge balancing dopant may be acidic. The charge balancing dopant may be a polyanion. Preferably the charge balancing dopant comprises a sulfonate, such as poly (styrene sulfonate) (PSS) where the PEDT conducting polymer is blended with acidic polar PSS groups.

An excess of the material comprising the charge balancing dopant may be present. It will be understood that any excess of the material comprising the charge balancing dopant will not be performing the function of doping and, so, will be present in a neutral form, for example as a salt or an acid. The excess of the material comprising the charge balancing dopant may be present as a charged species together with one or more counterions. These counterions may interact with the hole transport material to form the irreversible binding interaction. Preferably, the excess of the material comprising the charge balancing dopant comprises sulfonic acid groups or a salt thereof.

Polar substituent groups on the hole transporting material may interact with the polar groups in the poly(styrene sulfonate) by irreversibly binding thereto, thereby stabilising the hole transport layer that is formed.

Another preferred hole injecting material is polyaniline formulated with sulphonic acid.

The method according to the third aspect may include a further step of forming a further layer of the device on the hole transport layer by depositing an electroactive material in a suitable solvent on the hole transport layer. The further layer may be the emissive layer.

The method according to the third aspect may include a further step of heating the hole transport layer. Alternatively, the method may positively exclude such a step.

The thickness of the hole transport layer may be from 10 to 50 nm.

In the method according to the third aspect of the present invention, the hole transport layer is formed by depositing a solution comprising hole transport material. In one embodiment, the solution consists of the hole transport material dissolved in a suitable solvent or mixture of solvents.

In another embodiment of the third aspect of the invention, the solution comprises a hole transport material together with at least one other electroactive material in a suitable solvent or mixture of solvents. The other electroactive material may be selected from an emissive material or a charge transport material, for example. By appropriate selection of the other electroactive material, it has been found that after deposition, the hole transport material and the other electroactive material may phase separate to form two layers of the device; the hole transport material phase separating to form the hole transport layer on the conducting layer and the at least one other electroactive material forming a further electroactive layer on the hole transport layer.

In the embodiment where the hole transport material is deposited together with another electroactive material in a suitable solvent and then allowed to phase separate after deposition, it will be understood that there is no advantage (with respect to forming the next layer of the device) in the hole transport material being rendered insoluble and, thus, it is not essential for the hole transport material to irreversibly bind to the conducting material.

Therefore, the third aspect of the invention further provides a method for forming an organic electronic device, including the steps of:

forming a conducting layer comprising a conducting material; and forming a hole transport layer on the conducting layer by depositing a solution comprising a semiconductive hole transport material together with at least one other electroactive material directly onto the conducting layer, characterised in that the hole transport material phase separates from the at least one other electroactive material after deposition to form the hole transport layer comprising the semiconductive hole transport material on the conducting layer wherein one of the semiconductive hole transport material at the at least one other electroactive material contains a polar substituent group.

The at least one other electroactive material therefore forms an electroactive layer on the hole transport layer.

For optimising solution processing, particularly ink jet printing, a mixture of solvents may be present in the aforementioned solution.

It is necessary in this embodiment for the hole transport material and the at least one other electroactive material to be soluble in a common solvent. Preferably, a non-polar solvent is used and it is therefore preferred that the polar substituent group is a neutral polar substituent group present in sufficiently low concentration to solubilise the material it is bound to in a polar solvent without rendering this material insoluble in non-polar solvents. In contrast, a charged polar substituent group is likely to render the material insoluble in non-polar solvents even at relatively low concentrations.

In order to achieve phase separation, the hole transport material should have an affinity for the conducting material and the at least one other electroactive material should have no affinity or a weaker affinity for the conducting material. To this end, when the conducting material contains an acid, the hole transport material preferably contains polar substituent groups and the polar substituent groups preferably react with the conducting material to form the conjugate base of the acid.

The conducting material may comprise an organic conducting material, for example an organic hole injecting material as defined anywhere herein.

It has been found that, in one embodiment, the hole transport material has an affinity for the conducting material when the conducting material contains polar groups, as described anywhere herein, and the hole transport material contains polar substituent groups, as described anywhere herein. Particularly, the hole transport material may be as defined anywhere in relation to the first aspect of the invention.

The affinity may be optimised by selection of the number and location of the polar groups in the conducting material and the number and location of the polar substituent groups in the hole transport material. In this regard, when the hole transport material comprises a polymer, it is desirable for side chains or side groups pendant from the polymer backbone to comprise the polar substituent groups. Preferably, the side chains or side groups are not in conjugation with the polymer backbone. In this embodiment, the conducting material preferably comprises an organic conducting material, more preferably an organic conducting polymer, more preferably PEDT doped with a suitable charge balancing dopant. The charge balancing dopant may be acidic. The charge balancing dopant may be a polyanion. Preferably the charge balancing dopant comprises a sulfonate, such as poly(styrene sulfonate) (PSS) where the PEDT conducting polymer is blended with acidic polar PSS groups.

The hole transporting material preferably comprises alkyl amine substituent groups, such as morpholine substituent groups, as discussed above.

In another embodiment, the surface of the conducting layer is treated prior to deposition of the solution comprising the hole transport material and the further electroactive material in order to render the surface of the conducting layer hydrophobic such that deposition of a polymer blend according to the third aspect of the invention will phase separate with the non-polar material at the conducting layer surface. By this technique, a phase separated blend may be formed using a non-polar hole transporting material and an electroactive material comprising a polar substituent, for example morpholine. Any suitable known surface treatment may be used, for example treatment with chlorosilanes.

Preferably, the at least one other electroactive material comprises an electroactive polymer. More preferably, the at least one other electroactive material comprises an emissive material, particularly an emissive polymer.

When phase separation occurs, it is possible to form the hole transport layer and a further electroactive layer of the device (for example the emissive layer) in a one step process.

In one embodiment, the hole transport layer also may function as an emissive layer in the device, the hole transport material functioning to transport holes to the electroactive layer situated thereon and also to emit light. In this embodiment, the hole transport layer may be considered as a first emissive layer and the electroactive layer situated thereon preferably is a second emissive layer of the device. Preferably, the colour of the combined emission seen from the first and second emissive layers is white. To this end, preferably the hole transport layer (first emissive layer) emits blue light and the second emissive layer emits light of a longer wavelength. The blue light in combination with the longer wavelength light achieves white light emission from the device. Preferably, the hole transport layer (first emissive layer) emits blue light and the second emissive layer emits yellow light.

The "white light" may be characterised by a CIE x coordinate equivalent to that emitted by a black body at 3000-9000K and CIE y coordinate within 0.05 of the CIE y co-ordinate of said light emitted by a black body.

The "blue light" may be characterised by a CIE x co-ordinate less than or equal to 0.25, more preferably less than or equal to 0.2, and a CIE y co-ordinate less than or equal to 0.3, more preferably less than or equal to 0.2.

Yellow light may be characterised by CIE coordinates in the range x>0.3, y>0.3.

In this embodiment, the hole transport material may be any suitable material, particularly any material described herein, provided that it is capable of emitting light, preferably blue light. A preferred blue light emitting, hole transporting polymer has formula 100:

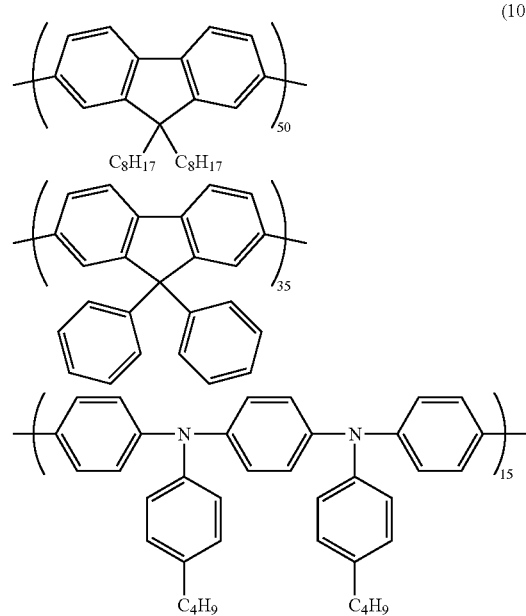

Any suitable emissive material may be used as the electroactive polymer in the second emissive layer.

The third aspect of the invention further provides an organic electronic device obtained or obtainable by one of the method according to the third aspect of the present invention. Preferred features of the device are as discussed anywhere above in relation to the first aspect of the present invention.

In a fourth aspect, the invention provides a method for forming an organic electronic device, including the steps of:
forming a conducting layer comprising a conducting material; and
forming a hole transport layer over the conducting layer by depositing a semiconductive hole transport material from solution in a non-polar solvent, the hole transport layer being substantially insoluble in a polar solvent; and
forming an emissive layer on the hole transport layer by depositing an emissive material from a solution in the polar solvent wherein the emissive material contains a neutral polar substituent group.

For optimising solution processing, particularly ink jet printing, a mixture of solvents may be present in the aforementioned solutions.

The conducting material may be as described anywhere herein.

The polar substituent groups are covalently attached to the emissive material. In the absence of the polar substituent groups, the emissive material still is capable of emission. Thus, the polar substituent groups substantially do not affect the electronic properties of the emissive material.

Preferred neutral polar substituent groups are as discussed in the first aspect of the invention. The use of neutral polar substituent groups avoids the possibility of device performance being adversely affected by doping of the emissive material that may be caused by dissociating groups charged polar substituent groups.

Turning to the fifth aspect of the invention, as seen in the discussion above relating to the first, second, third and fourth aspects of the present invention, some of the materials used in the methods of the invention are novel. Therefore, the fifth aspect of the invention provides novel materials as described above in relation to the first, second, third and fourth aspects of the present invention. In particular, the fifth aspect of the invention provides a polymer suitable for use in an organic electronic device, said polymer comprising a repeat unit comprising an aryl or heteroaryl group, characterised in that the polymer comprises optionally substituted units of formula (84) pendant from the polymer backbone:

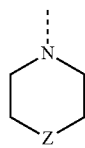

(84)

wherein Z is selected from the group consisting of O, S or NR''' and R''' is H or a substituent.

Where Z is NR''', R''' may be a polar or non-polar substituent. Preferred polar substituents R''' include amino groups, preferably trialkylamino groups; polar heterocyclic groups, for example pyridine; and ether and polyether groups. Preferred non-polar substituents R''' include C1-20 hydrocarbyl.

Preferably, Z=O, i.e. the unit of formula (84) is optionally substituted morpholine.

Preferably, the aforementioned aryl or heteroaryl group is in the polymer backbone.

The units of formula 84 may be spaced from the polymer backbone by spacer groups as discussed above in relation to the first aspect of the present invention. When present, preferred spacer groups include phenyl and alkyl chains such as (CH2)6.

It is preferred that there is a break in conjugation between the units of formula 84 and the polymer backbone.

The polymer may be a hole transport polymer, electron transport polymer or emissive polymer, for example.

Preferably, the polymer according to the fifth aspect is partially or fully conjugated along the polymer backbone.

Preferred aryl and heteroaryl groups are as discussed above in relation to the first aspect of the present invention. It is particularly preferred that the morpholine groups are pendant from fluorene groups in the polymer backbone, as shown below in formula 85 for example:

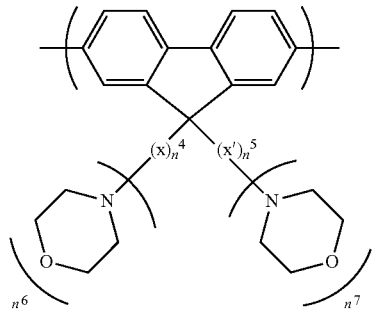

(85)

Where x and x' are optional spacer groups as defined anywhere herein; n4 and n5 each independently is in the range of from 0 to 5; n6 is 1 or 2; and n7 is 1 or 2.

The polymer according to the fifth aspect may comprise a copolymer. Suitable co-repeat units to be present in the copolymer include fluorene repeat units; and triarylamines, such as those having formulae 7 to 12 defined above.

In another embodiment, the fifth aspect of the invention provides a semiconductive hole transport material containing polar substituent groups, the polar substituent groups substantially not affecting the electronic properties of the hole transport material and the hole transport material being soluble in a polar solvent. Preferably, the hole transport material has a pH less than or equal to 3. Other preferred features of the material are as discussed above anywhere in relation to the first, second, third or fourth aspects of the invention.

In still another embodiment, the fifth aspect of the invention provides a material comprising a semiconductive hole transport material and one or more functional groups covalently attached to the semiconductive hole transport material, each functional group comprising a substituent, the or each functional group not being in conjugation with the semiconductive hole transport material and the substituent(s) rendering the material soluble in a polar solvent. The presence of the functional group(s) substantially does not affect the electronic properties of the semiconductive hole transport material because it is/they are not in conjugation with the semiconductive hole transport material.

The substituent may comprise a polar substituent group as defined anywhere herein. The hole transport material may be as discussed anywhere in relation to the first aspect of the present invention.

Preferably, the hole transport material comprises a hole transport polymer, the functional group being comprised in a side chain or side group pendant from the backbone of the polymer.

When the functional groups are comprised in a side chain or side group pendant from the backbone of the polymer, the functional groups may be linked to the polymer backbone by spacer groups, for example as described anywhere herein. Preferred spacer groups provide a break in conjugation between the functional group and the polymer backbone. More preferred spacer groups include saturated hydrocarbyls.

Preferably, the hole transport material contains a plurality of functional groups.

A sixth aspect of the invention provides a method for forming an organic electronic device, including the steps of:

forming a conducting layer comprising a conducting material; and forming a hole transport layer on the conducting layer by depositing a solution comprising a semiconductive hole transport material, characterised in that said hole transport material contains substituent groups that bind to said conducting material to render the hole transport layer insoluble without substantially affecting the electronic properties of the hole transport material.

For optimising solution processing, particularly ink jet printing, a mixture of solvents may be present in the aforementioned solution.

The hole transport material may be deposited from solution in a non-polar solvent. Alternatively, as discussed above, the hole transport material may be deposited from solution in a polar solvent.

In the context of the sixth aspect of the invention, the hole transport layer is rendered insoluble insofar as it is possible to deposit a solution of the next layer of the device on the hole transport layer, in which solution the hole transport material might otherwise be soluble in the absence of the binding interaction between the hole transport material and the conducting material.

Typically, the hole transport material according to the sixth aspect comprises a hole transport polymer. In this case, preferably, side chains or side groups pendant from the backbone of the hole transport polymer comprise the substituents that bind to the conducting material. This has the benefit of decoupling the effects that the interaction could have on the electronic properties of the polymer. Preferably, the substituents which bind to the conducting material are not in conjugation with the polymer backbone.

The nature of the binding may vary from system to system. Binding mechanisms include protonation of the hole transport material by the conducting material; hydrogen bonds formed between the hole transporting material and the conducting material; and dipolar interactions between the hole transport material and the conducting material. Preferably, the substituents accept protons from the conducting material to generate binding.

The substituents may comprise polar substituent groups, as discussed above in relation to the first aspect of the invention. Preferably, the substituents contain O or N and more preferably, the O or N atoms accept protons from the conducting material to generate binding. The hole transport material may be as discussed anywhere in relation to the first aspect of the present invention.

Generally, the binding between the hole transport material and the conducting material according to the sixth aspect occurs spontaneously during deposition of the hole transport material on the conducting layer. However, the possibility of treating the hole transport layer after deposition is not excluded.

It may also be desirable to control the contact time between the solution comprising the semiconductive hole transport material and the conducting layer.

Of course, the electronic properties of the conducting material must be compatible with device performance, i.e. the conducting material should be capable of transporting holes from the anode to the hole transport layer.

The conducting material may contain polar groups.

Preferably, the conducting material comprises a conducting polymer.

The conducting material may comprise an organic conducting material, such as a hole injecting material.

One particularly preferred organic conducting material comprises a hole injecting material, such as poly(ethylene dioxythiophene) (PEDT) doped with a charge balancing dopant. The charge balancing dopant may be acidic. The charge balancing dopant may be a polyanion. Preferably the charge balancing dopant comprises a sulfonate, such as poly(styrene sulfonate) (PSS) where the PEDT conducting polymer is blended with acidic polar PSS groups.

An excess of the material comprising the charge balancing dopant may be present. It will be understood that any excess of the material comprising the charge balancing dopant will not be performing the function of doping and, so, will be present in a neutral form, for example as a salt or an acid. The excess of the material comprising the charge balancing dopant may be present as a charged species together with one or more counterions. These counterions may interact with the hole transport material to form the irreversible binding interaction. Preferably, the excess of the material comprising the charge balancing dopant comprises sulfonic acid groups or a salt thereof.

The hole transport material may be protonated by a conducting material such as PEDT doped with PSS.

Another preferred hole injecting material is polyaniline formulated with sulphonic acid.

The method according to the sixth aspect may include a further step of forming a further layer of the device on the hole transport layer by depositing an electroactive material in a suitable solvent on the hole transport layer. The further layer may be the emissive layer.

The method according to the sixth aspect may include a further step of heating the hole transport layer. Alternatively, the method may positively exclude such a step.

The thickness of the hole transport layer may be from 10 to 50 nm.

In the method according to the sixth aspect of the present invention, the hole transport layer is formed by depositing a solution comprising hole transport material. In one embodiment, the solution consists of the hole transport material dissolved in a suitable solvent or mixture of solvents.

In another embodiment of the sixth aspect of the invention, the solution comprises a hole transport material together with at least one other electroactive material in a suitable solvent or mixture of solvents. The other electroactive material may be selected from an emissive material or a charge transport material, for example. By appropriate selection of the other electroactive material, it has been found that after deposition, the hole transport material and the other electroactive material may phase separate to form two layers of the device; the hole transport material phase separating to form the hole transport layer on the conducting layer and the at least one other electroactive material forming a further electroactive layer on the hole transport layer.

EXAMPLES

Example 1

A monomer for preparing a polymer soluble in a polar solvent may be prepared according to the following scheme.

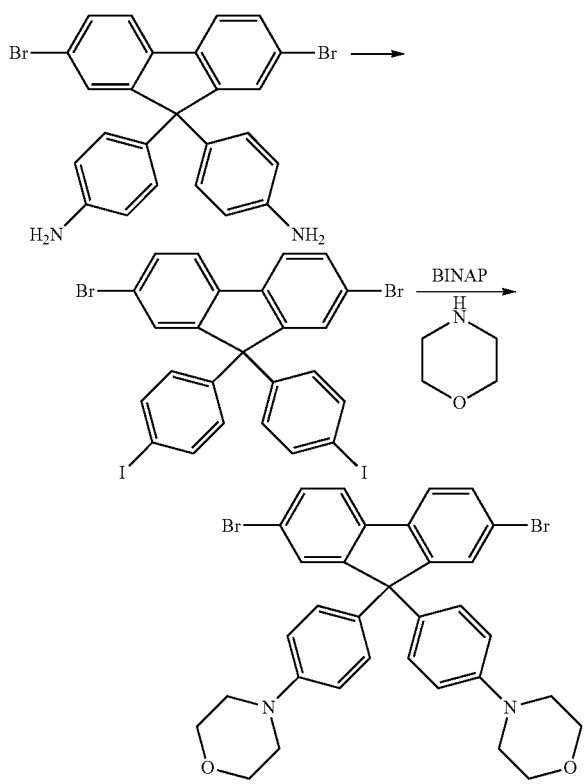

The bromine substituents may be replaced with boronic acid or ester groups, to form Monomer 1 shown below, and polymerised with dibromo-TFB to form Polymer 1 in accordance with the method disclosed in WO 00/53656:

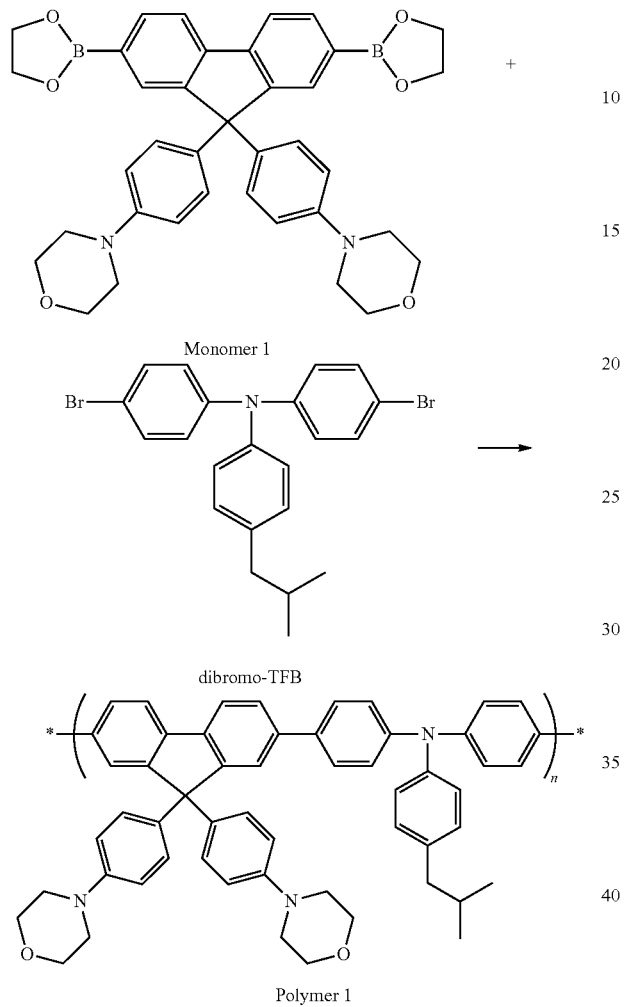

A layer of PEDT/PSS, available from H C Starck as Baytron P® was deposited by spin coating onto an indium tin oxide anode supported on a glass substrate (available from Applied Films, Colorado, USA) Polymer 1 was deposited onto the PEDT/PSS layer by spin coating from methanol solution, followed by deposition of an electroluminescent layer of poly-9,9-di(n-octyl)fluorene from xylene solution. A cathode was formed by evaporating onto the electroluminescent layer a first layer of barium metal and a capping layer of aluminium. The device was sealed using an airtight metal container available from Saes Getters SpA.

Example 2

A monomer for preparing a polymer soluble in a polar solvent may be prepared according to the following scheme.

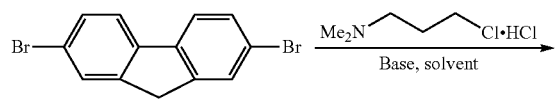

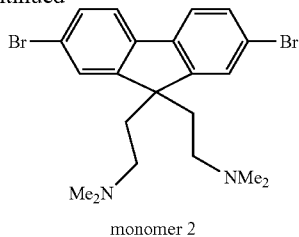

monomer 2

The bromine substituents may be replaced with boronic acid or ester groups, to form Monomer 3 shown below, and polymerised with dibromo-TFB to form Polymer 2 in accordance with the method disclosed in WO 00/53656:

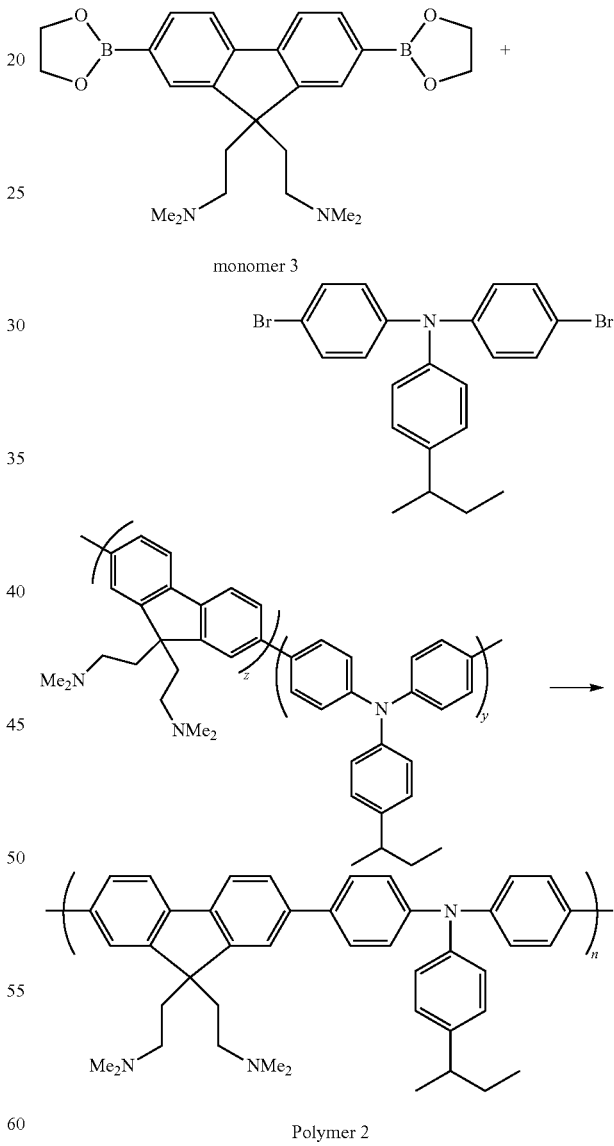

A layer of PEDT/PSS, available from H C Starck as Baytron P® was deposited by spin coating onto an indium tin oxide anode supported on a glass substrate (available from Applied Films, Colorado, USA) Polymer 2 was deposited onto the PEDT/PSS layer by spin coating from methanol solution, followed by deposition of an electroluminescent layer of poly-9,9-di(n-octyl)fluorene from xylene solution. A cathode was formed by evaporating onto the electroluminescent layer a first layer of barium metal and a capping layer of aluminium. The device was sealed using an airtight metal container available from Saes Getters SpA.

Example 3

A monomer for preparing a polymer soluble in a polar solvent may be prepared according to the following scheme.

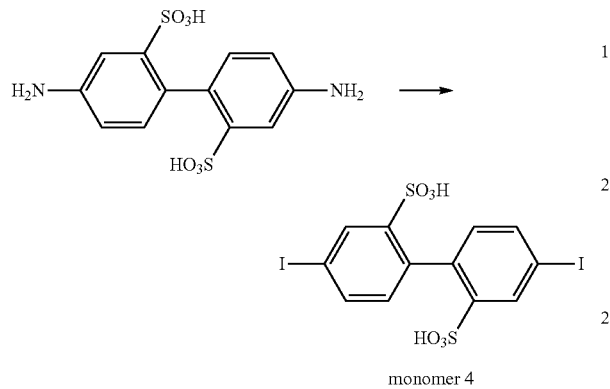

monomer 4

The bromine substituents may be replaced with boronic acid or ester groups, to form Monomer 5 shown below, and polymerised with dibromo-TFB to form Polymer 3 in accordance with the method disclosed in WO 00/53656:

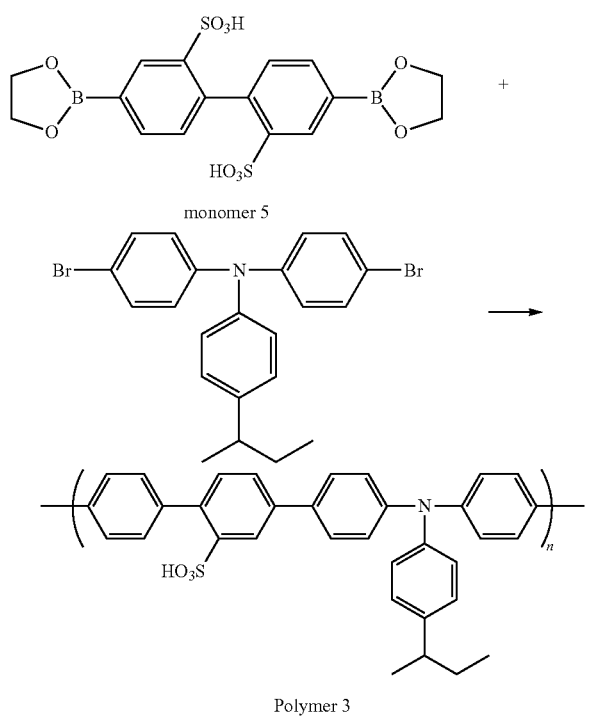

Polymer 3

A layer of PEDT/PSS, available from H C Starck as Baytron P® was deposited by spin coating onto an indium tin oxide anode supported on a glass substrate (available from Applied Films, Colorado, USA) Polymer 3 was deposited onto the PEDT/PSS layer by spin coating from methanol solution, followed by deposition of an electroluminescent layer of poly-9,9-di(n-octyl)fluorene from xylene solution. A cathode was formed by evaporating onto the electroluminescent layer a first layer of barium metal and a capping layer of aluminium. The device was sealed using an airtight metal container available from Saes Getters SpA.

Example 4

2-Step Synthesis of A9 Dibromide Shown in the Reaction Scheme Below

Scheme 1. N-(6-bromohexyl)morpholine

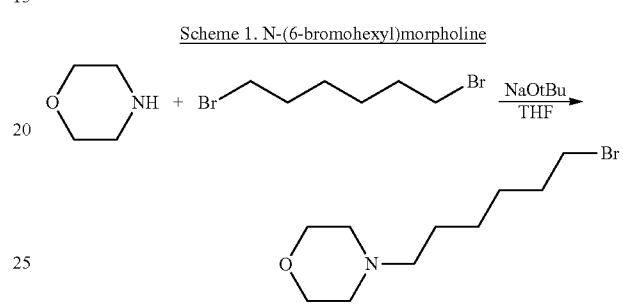

Scheme 2. 2,7-Dibromo-9,9'-bis-(6-N-morpholinyl)hexyl)fluorine

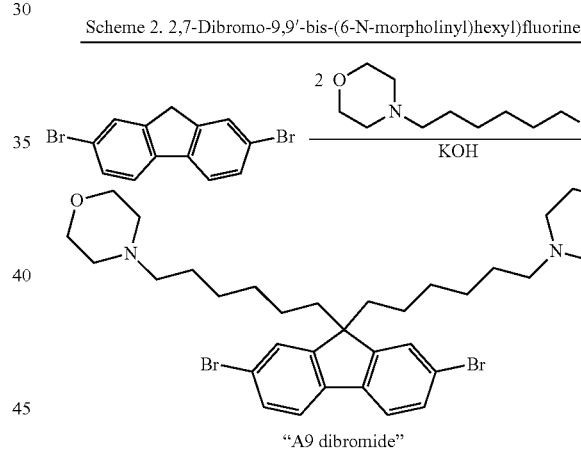

"A9 dibromide"

4.1 N-(6-bromohexyl)morpholine

Under nitrogen 250 ml anhydrous THF were added to 37 g (1.1 eq, 385 mmol) sodium tert-butoxide. Then 30.45 g (1 eq, 350 mmol) morpholine were added neat. The suspension was heated to 50° C. for 1 h. After cooling to RT, 1.21 anhydrous THF and 85.29 g (1 eq, 350 mmol) dibromohexane in ~150 ml anhydrous THF were added. After 1 h at RT the mixture was heated to 85° C. over night. The overstanding solution was decanted and all volatiles removed in vacuo. The residue was dissolved in ether and water and the organic layer extracted with 2M hydrochloric acid. After dilution with water and ether, KOH flakes were added under vigorous stirring and cooling until pH=10. After phase separation, the aqueous layer was extracted with ether. The combined organic layers were dried over brine and MgSO4 and all volatiles removed to yield 40 g. Further purification by column chromatography (70% hexane, 30% ethyl acetate, 5% triethylamine) yielded 14.56 g, 99% by GCMS. 1H-NMR (400 MHz, CDCl3): [ppm]=3.71 (t, J=4 Hz, 4H), 3.41 (t, J=6.8 Hz, 2H), 2.42 (t, J=4 Hz, 4H), 2.32 (t, J=7.6 Hz, 2H), 1.48 (m, 4H), 1.34 (m, 2H).

4.2 2,7-Dibromo-9,9'-bis-(6-(N-morpholinyl)hexyl)fluorine

A mixture of 24.5 g (2.5 eq, 98 mmol) N-(6-bromohexyl) morpholine, 12.7 g (1 eq, 39 mmol) 2,9-dibromofluorene, and 170 mg (0.01 eq, 0.4 mmol) Aliquat 336 was heated to 80° C. 11 g (5 eq, 196 mmol) KOH in 25 ml water were added. After 18 h the crude reaction mixture was diluted with dichloromethane and water. After phase separation the organic layer was washed with water, dried over brine and MgSO4 and all volatiles removed in vacuo. Further purification by column chromatography (70% hexane, 30% ethyl acetate, 5% triethylamine) and recrystallisation from methanol yielded 8 g (31% yield) pale yellow crystals (plates), 100% pure by high-sensitivity GCMS. 1H-NMR (400 MHz, CDCl3): [ppm]=7.48 (m, 4H), 7.43 (s, 2H), 3.68 (t, J=4.8 Hz, 8H), 2.35 (t, J=4 Hz, 8H), 2.19 (t, J=8 Hz, 4H), 1.91 (m, 4H), 1.29 (m, 4H), 1.08 (m, 8H), 0.59 (m, 4H).

4.3

The A9 dibromide monomer may be used in a Suzuki polymerisation reaction to form an electroactive polymer. The polymer containing the repeat unit:

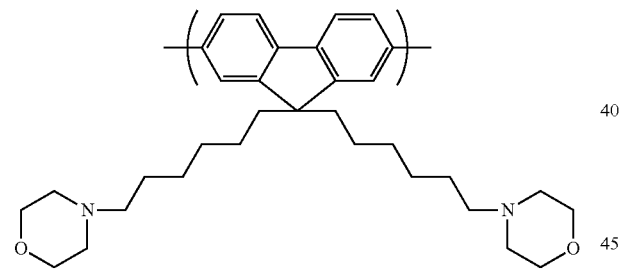

is capable of being protonated by a conducting material, such as PEDT doped with a charge balancing dopant. The charge balancing dopant may be acidic. The charge balancing dopant may be a polyanion. Preferably the charge balancing dopant comprises a sulfonate, such as poly(styrene sulfonate) (PSS) where the PEDT conducting polymer is blended with acidic polar PSS groups.

Thus, when the polymer is deposited onto a layer of PEDT/PSS, the protonation interaction results in a stable A9 polymer layer on which further layers may be deposited.

Example 5

An AB copolymer comprising 50% of the A9 repeat unit of Example 4 and 50% of the TFB repeat unit was prepared by Suzuki polymerisation according to the method described in WO 00/53656.

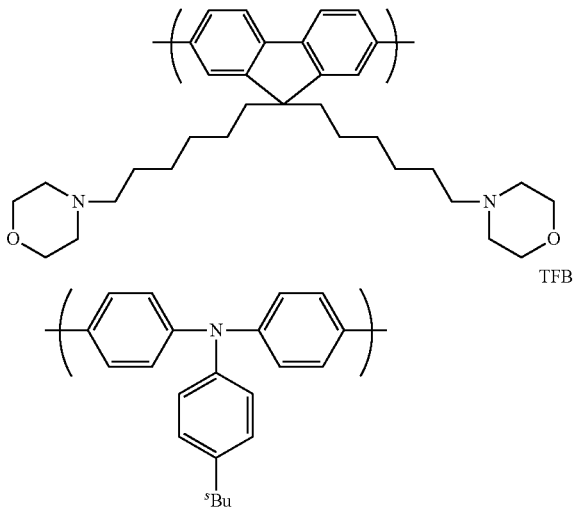

Example 6

A layer of PEDT/PSS, available from H C Starck as Baytron P® was deposited by spin coating onto an indium tin oxide anode supported on a glass substrate (available from Applied Films, Colorado, USA). The A9-TFB polymer of example 5 was deposited over the PEDT/PSS layer by spin-coating from xylene solution and the solvent was evaporated to form a 170 nm thick layer of A9-TFB polymer.

This layer of was subjected to continuous spin-rinsing with xylene until the thickness of the layer remained constant even with further rinsing, after which a 77 nm thick film of A9-TFB remained.

For the purpose of comparison, a 1:1 copolymer of 9,9-dioctylfluorene and TFB was deposited on a PEDT/PSS film and spin rinsed in the same way, after which none of the comparative copolymer layer remained, thus demonstrating the insolubilising effect of the polar substituent group of the A9-TFB copolymer.

Example 7

A layer of PEDT/PSS, available from H C Starck as Baytron P® was deposited by spin coating onto an indium tin oxide anode supported on a glass substrate (available from Applied Films, Colorado, USA). A blend of the A9-TFB polymer of example 5 and poly(9,9-dioctylfluorene) was deposited over the PEDT/PSS layer by spin-coating from xylene solution. The blend underwent vertical phase separation to form a bilayer of an A9-TFB hole transporting layer and an emissive layer of poly(9,9-dioctylfluorene). A cathode was deposited over the emissive layer and the device was sealed in accordance with the method of Example 3.

The invention claimed is:
1. An organic electronic device comprising an emissive layer and a hole-transporting layer, said hole-transporting layer comprising a semiconductive hole transport polymer containing fluorene, spirofluorene, indenofluorene, phenylene, phenylenevinylene, thiophene, benzothiadiazole, carbazole, or triarylamine repeat units in a backbone of the polymer, at least some of which repeat units have polar substituent groups, wherein said polar substituent groups do not substantially affect the electronic properties of the hole transport polymer, and the hole transport polymer is soluble in a polar solvent.

2. An organic electronic device according to claim 1, wherein the nature and number of polar substituent groups are selected such that the hole transport polymer is soluble in a polar solvent having a dielectric constant at 20° C. of greater than 15.

3. An organic electronic device according to claim 1, wherein the polar substituent groups independently are selected from aliphatic or alicyclic oxygen-, nitrogen-, sulphur- and phosphorous-containing groups.

4. An organic electronic device according to claim 1, wherein the polar substituent groups independently are selected from polyether, hydroxyl, ester, acid, amine, cyano, amide, imine, sulfonate, and sulfate.

5. An organic electronic device according claim 1 wherein the polar substituent groups comprise a plurality of groups XY, where XY represents a group with a high dissociation constant such that it is ionized completely.

6. An organic electronic device according to claim 1, wherein the hole transport polymer comprises a repeat unit comprising general formula 25:

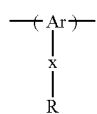

(25)

where Ar represents an aryl or heteroaryl group selected from the group consisting of fluorene, spirofluorene, indenofluorene, phenylene, phenylenevinylene, thiophene, benzothiadiazole, carbazole, and triarylamine; x represents an optional organic spacer group; and R represents a polar substituent group.

7. An organic electronic device according to claim 6, wherein x comprises a group which breaks any conjugation between R and Ar.

8. An organic electronic device according claim 6, wherein Ar represents fluorene.

9. An organic electronic device according to claim 8, wherein the hole transport polymer comprises a repeat unit general formula I:

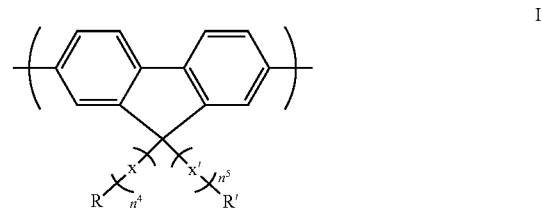

I where x and x' are optional organic spacer groups; R and R' are polar substituent groups; and $n^4$ and $n^5$ each independently is in the range of from 0 to 5.

10. An organic electronic device according to claim 6, wherein the polymer contains a further aryl or heteroaryl repeat unit.

11. An organic electronic device according to claim 10, wherein the further repeat unit is a triarylamine repeat unit or a fluorene repeat unit.

12. An organic electronic device according to claim 1 which is substantially insoluble in a non-polar solvent.

* * * * *